(12) United States Patent
Sun et al.

(10) Patent No.: US 12,463,618 B2
(45) Date of Patent: Nov. 4, 2025

(54) MAGNETOELECTRIC ANTENNA ARRAYS

(71) Applicants: Nian Xiang Sun, Winchester, MA (US); Hwaider Lin, Somerville, MA (US)

(72) Inventors: Nian Xiang Sun, Winchester, MA (US); Hwaider Lin, Somerville, MA (US)

(73) Assignee: Winchester Technologies, LLC, Winchester, MA (US)

( * ) Notice: Subject to any disclaimer, the term of this patent is extended or adjusted under 35 U.S.C. 154(b) by 1033 days.

(21) Appl. No.: 17/503,293

(22) Filed: Oct. 16, 2021

(65) Prior Publication Data

US 2022/0038074 A1 Feb. 3, 2022

Related U.S. Application Data

(63) Continuation-in-part of application No. 16/304,802, filed on Nov. 27, 2018, now Pat. No. 11,355,692.

(60) Provisional application No. 63/115,148, filed on Nov. 18, 2020.

(51) Int. Cl.
| | |
|---|---|
| *H03H 9/17* | (2006.01) |
| *G01H 9/00* | (2006.01) |
| *G01R 33/02* | (2006.01) |
| *H03H 9/13* | (2006.01) |
| *H03H 9/135* | (2006.01) |
| *H03H 9/22* | (2006.01) |

(52) U.S. Cl.
CPC .............. *H03H 9/171* (2013.01); *G01H 9/00* (2013.01); *G01R 33/02* (2013.01); *H03H 9/13* (2013.01); *H03H 9/135* (2013.01); *H03H 9/22* (2013.01)

(58) Field of Classification Search
CPC .......... H03H 9/171; H03H 9/13; H03H 9/135; H03H 9/22; H03H 9/173; H03H 9/175; H03H 9/62; G01H 9/00; G01R 33/02; G01R 33/0286; H01Q 1/364; H01Q 1/38; H01Q 21/061; H01Q 21/21; H01P 7/00
See application file for complete search history.

(56) References Cited

U.S. PATENT DOCUMENTS

| | | | | |
|---|---|---|---|---|
| 8,803,751 | B1 * | 8/2014 | Miller | H01Q 7/06 343/787 |
| 2009/0085695 | A1 * | 4/2009 | Srinivasan | H01P 1/19 333/219.2 |
| 2022/0308125 | A1 * | 9/2022 | Sun | G01R 33/0286 |
| 2022/0407230 | A1 * | 12/2022 | Sun | H01Q 7/08 |

\* cited by examiner

*Primary Examiner* — J. San Martin
(74) *Attorney, Agent, or Firm* — Jie Tan; JT Law Services, PC

(57) ABSTRACT

Two or more ME resonators are connected in series and in parallel generating a high sensitive, energy efficient and broadband miniature antenna and other conductor devices.

32 Claims, 19 Drawing Sheets

MAGNETOELECTRIC ANTENNA ARRAYS

CROSS REFERENCES

Priority is claimed from U.S. Provisional Application No. 63/115,148, filed on Nov. 18, 2020, entitled "Magnetoelectric Antenna Arrays," the entirety of which is hereby incorporated by reference; and this application is also a continuation in part of U.S. patent application Ser. No. 16/304,802, filed on May 31, 2017 entitled "Nanoscale Radio Frequency Magnetoelectric Antenna", the entirety of which is hereby incorporated by reference. This invention was made with government support under contract number W9113NF18C0095 awarded by Army Research Office, U.S. Army DEVCOM Army Research Laboratory. The government has certain rights in the invention.

BACKGROUND

Field of the Invention

The present patent application relates to a type of ultra-compact and efficient antennas for use in wireless communication systems, Bio-medical applications, satellite and radar systems. More particularly, the present patent application describes an antenna comprising of arrays of resonators connected in series and/or in parallel that is capable of receiving electromagnetic (EM) signals from an AC source operating anywhere from kHz to GHz frequency with improved radiation efficiency and bandwidth and radiating efficiently the same frequency EM signals into the air. This highly efficient and yet compact antenna comprises a plurality of arrays of resonators with a layered radiating aperture formed by a combination of piezoelectric and magnetic materials stacked on top of one another.

Description of the Related Art

Antennas are a critical component in all radiation communications. As cell phones and tablets become indispensable parts of living style, the demand for ultra-compact and more efficient antennas is never-ending. Antennas receive and transmit signals through electromagnetic (EM) wave resonance; as such, traditional antennas have sizes that are comparable to the electromagnetic (EM) wavelength $\lambda 0$. Typically, these antennas must have a size of more than 20/10, i.e., $\lambda 0/10$ of the EM wavelength $\lambda 0$. With fixed transmission wavelength, it has become very challenging for electronic engineers to miniaturize antennas, particularly for the applications of very high frequency (VHF; 30~300 MHz) or ultra-high frequency (UHF; 0.3~3 GHZ) transmissions.

For antennas, another challenge is the ground plane effect. The ground plane plays a major role in determining the antenna's radiation characteristics, including gain. However, the imaging currents flowing in the opposite direction of planer antennas can cancel out the radiation from the antennas. This effect requires large profile antennas to be placed in a vertical position and perpendicular to the ground plane surface, such as a vertical quarter-wave dipole, where the imaging currents serve as part of an antenna for in-phase radiation.

The inventors of this application have previously identified that miniature electronic components can be developed because of the phenomena of strong magnetoelectric (ME) coupling effect between the electric and magnetic orders achieved in magnetoelectric heterostructures. See Tianxiang Nan, et al. "Acoustically Actuated Ultra-Compact NEMS Magnetoelectric Antennas," *Nature Communications*, Vol 8, p296, Aug. 2017. Strong ME coupling, realized dynamically at radio frequencies (RF) in ME heterostructures, enables voltage-induced RF magnetic currents that radiate EM waves, effectuating a new receiving and transmitting mechanism. This new receiving and transmitting mechanism can reduce antenna sizes in 1 to 2 magnitude orders as well as at least-18 dBi antenna gain in addition to ground plane immunity.

Thus this ME coupling effect has made it possible to develop novel magnetoelectric device components that operate at room temperatures, such as spintronics-based components, low-frequency magnetic sensors, and reconfigurable RF components.

Accordingly, there is a great need for novel antenna designs using ME coupling mechanisms for improved efficiency and bandwidth capacity.

ASPECTS AND SUMMARY OF THE INVENTION

The present invention provides a new design concept using magnetoelectric (ME) resonator arrays in building an integrated antenna to improve performance.

In one embodiment, an array of Thin-Film Bulk Acoustic Resonators (FBAR) is electrically connected in parallel or in series in forming a single antenna. In another aspect of an embodiment, an array of Nano-Plate Resonators (NPR) is electrically connected in parallel or in series in forming a single antenna. In another aspect of embodiment a mixture of FBAR and NPR arrays are electronically connected in parallel or in series in forming a single antenna.

In another embodiment, a Solidly Mounted Resonator (SMR), or an array of Solidly Mounted Resonators are electrically connected in parallel or in series in forming a single antenna. In one aspect of the embodiment, FBAR, NPR, and SMR resonators have a heterostructure of ferromagnetic/ferroelectric thin film with a layer of piezoelectric material that resonates at acoustic resonance frequencies. In one aspect of an embodiment, the SMR comprises a layer of low acoustic impedance material that functions as part of an acoustic mirror; the low acoustic impedance material layer comprises a material having an low acoustic impedance lower than $50 \text{ g/cm}^2\text{-sec} \times 10^5$, selected from Aluminum (Al), Beryllium (Be), Bismuth (Bi), Cadmium (Cd), Cesium (Cs), Columbium (Nb), Copper (Cu), Gallium (Ga), Germanium (Ge), Indium (In), lead, Magnesium (Mg), Manganese (Mn), Plutonium (Pu), Potassium (K), Radium (Ra), Rubidium (Rb), Silver (Ag), Sodium (Na), Thallium (Tl), Thorium (Th), Tin (Sn), Titanium (Ti), Uranium dioxide ($UO_2$), Vanadium (V), Zinc (Zn), Zirconium (Zr), PMMA, quartz, Silicon dioxide ($SiO_2$), nano-porous methyl silsesquioxane (MSQ), nano-porous hydrogensilsesquioxane (HSQ), nano-porous mixtures of MSQ and HSQ, aerogel, etc. and also some piezoelectric materials such as Barium titanate ($BaTiO_3$), Gallium arsenide (GaAs), Lithium niobate ($LiNbO_3$), and Zinc oxide (ZnO).

In one aspect of an embodiment, the SMR comprises a layer of high acoustic impedance material that functions as part of an acoustic mirror; the high acoustic impedance material has at least acoustic impedance higher than $50 \text{ g/cm}^2\text{-sec} \times 10^5$, selected from Gold (Au), Molybdenum (Mo), Nickel (Ni), Platinum (Pt), Tantalum (Ta), Tungsten (W), Uranium (U), diamond-like carbon (DLC), Silicon doped diamond-like carbon (Si-DLC), etc. and also some piezoelectric materials such as Aluminum Nitride (AlN), Boron nitride (BN), Gallium nitride (GaN), and Silicon carbide (SiC).

In one aspect of the embodiment, the thickness of the individual layer of the high acoustic impedance material layers is configured to be one-quarter or one-half mechanical wavelength of the resonant frequency of the piezoelectric resonator. In one aspect of the embodiment, the thickness of the individual layers of the low acoustic impedance material layers is configured to be one-quarter or one-half mechanical wavelength of the resonant frequency of the piezoelectric resonator.

In one embodiment, a resonator electrode material is deposited with a material at least selected from Molybdenum (Mo), Titanium (Ti), Tungsten (W), Gold (Au), Platinum (Pt), Aluminum (Al), and Ru (Ruthenium) or the combination thereof.

In one embodiment, the resonator comprises a piezoelectric layer that is made of a material comprising at least one selected from Aluminum Nitride Scadium Nitride (AlS.N), Aluminum Nitride (AlN), $(Hf,X)O_2$ with X=Zr, Si, etc., Barium titanate ($BaTiO_3$), Gallium phosphate ($GaPO_4$), Lanthanum gallium silicate (LGS), Lead scandium tantalate (PST), Zinc oxide (ZnO), Quartz, Lead zirconate titanate (PZT), Lithium tantalate ($LiTaO_3$), Lead lanthanum zirconate titanate (PLZT), Bismuth ferrite (BFO), Lead magnesium niobate-lead titanate (PMN-PT), Lead-zinc niobate lead titanate (PZN-PT), Polyvinylidene fluoride (PVDF, PVDF (-TrFE)), Sodium bismuth titanate (NBT).

In one embodiment, the resonator comprises a magnetic layer that is made of a material comprising at least one selected from Iron (Fe), Nickel (Ni), Cobalt (Co), and alloys selected from Iron gallium (FeGa), Iron gallium alloy (FeGaX with X=B, C, etc.), Iron cobalt (FeCo), Iron cobalt alloy (FeCoX with X=B, C, V), Metglas, Iron cobalt silicon boron (FeCoSiB), Nickel iron (NiFe), Nickel iron alloy (NiFeX with X=Cu, Zn, Co, Mn, V, Al, Ta, Ru, etc.), Nickel molybdenum alloy, Iron silicon alloy, Cobalt platinum alloy, Terfenol and Terfenol-D ($Tb_xDy_{1-x}Fe_2$, y1 and x are a number), and spinel ferrites such as Nickel ferrite, Nickel zinc ferrite, Cobalt ferrite, Barium ferrite, Nickel zinc-aluminum ferrite, Manganese zinc ferrite, Strontium ferrite, Lithium ferrite, and hexaferrite or other ferrites.

In one embodiment, the piezoelectric layer crossing over an aperture structure, with out-of-plane excitation, allows for in-plane and out-of-plane vibration, while the magnetic layer also allows for in-plane and out-of-plane vibrations. Voltage-induced acoustic waves induce magnetization dynamics in the thin film heterostructure through the magnetoelectric coupling, leading to radiation of electromagnetic waves at the acoustic resonance frequencies. The magnetoelectric antennas sense the magnetic components of electromagnetic waves, leading to a piezoelectric voltage output. These multiple arrays of ME resonators made of new materials are connected in both series and parallel, providing high antenna gain, large bandwidth, strong ground plant immunity, and high sensitivity from the quasi-static or low-frequency magnetic field in a ME antenna array.

DETAILED DESCRIPTION OF THE PREFERRED EMBODIMENTS

Figure 1:
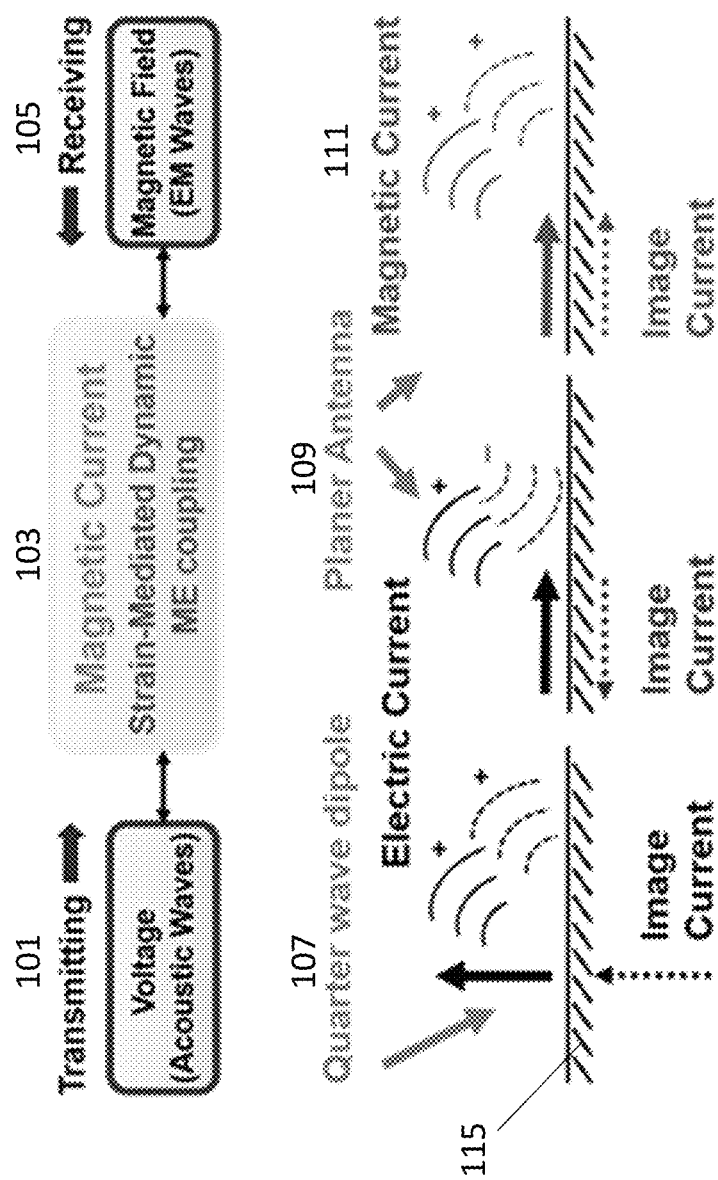
FIG. 1 schematically shows the antenna transmission mechanism and the ground plane effect in accordance with this application.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections but also include connections through intermediate elements or devices. For purposes of convenience and clarity only, directional (up/down, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

The present invention may be described herein in terms of functional block components and various processing steps. It should be appreciated that such functional blocks may be realized by any number of hardware and/or software components configured to perform the specified functions. For example, the present invention may employ various integrated circuit components, memory elements, processing elements, logic elements, look-up tables, and the like, which may carry out a variety of functions under the control of one or more microprocessors or other control devices in calculations, simulations, and measurement.

It should be appreciated that the particular implementations shown and described herein are illustrative of the invention and its best mode and are not intended to otherwise limit the scope of the present invention in any way. Furthermore, the connecting lines shown in the various figures contained herein are intended to represent exemplary functional relationships and/or physical couplings between the various elements. It should be noted that many alternative or additional functional relationships or physical connections may be present in a practical incentive system implemented in accordance with the invention.

The term "piezoelectricity" is the electricity resulting from pressure and latent heat resulting from electric charge that accumulates in certain solid materials-such as crystals, certain ceramics, and biological matters—in response to applied mechanical stress. Generally, the piezoelectric effect is observed from the linear electromechanical interaction between the mechanical and electrical states in crystalline materials with no inversion symmetry.

The term "Magnetoelectric (ME or alternatively M-E) coupling" refers to the phenomenon of using voltage to induce the mechanical formation and then to generate magnetic change, using magnetic change to induce the mechanical formation and then to generate voltage.

Application of magnetoelectric coupling phenomena can lead to voltage control of magnetism or magnetic field manipulation of polarization, which enables low power consumption, fast dynamic response, low loss, and compact devices. Great efforts have been made to achieve strong magnetoelectric coupling. It has been observed that magnetic/dielectric or magnetic/ferroelectric thin film heterostructures produce strong magnetoelectric coupling through a voltage controllable magnetic surface anisotropy mediated by spin-polarized charge. For ultra-thin magnetic film/ferroelectric slabs, because of combined strain-mediated and charge-mediated magnetoelectric coupling, a stronger magnetoelectric coupling effect is observed. For example, a multiferroic heterostructure with a magnetic semiconductor, 4 nm $La_{0.8}Sr_{0.2}MnO_3$ on PZT produced a hysteretic-like M-E curve at 100 K due to a charge mediated magnetoelectric coupling. Further, there is a thickness-dependent M-E behavior in Ni/BTO multiferroic heterostructures through the voltage-controlled magneto-optical Kerr signal, where the charge-mediated magnetic surface anisotropy increasingly dominates over the magnetoelastic anisotropy when decreasing the thickness of Ni thin film down to 5 nm.

Artificial multiferroic heterostructures with combined ferroelectric and ferromagnetic layers have attracted an ever-increasing amount of interest recently due to their strong magnetoelectric coupling at room temperature. Conventional antennas, are basically conductors that receive and transmit radio frequency waves that generate oscillating electric field and magnetic field through oscillating electric currents. Structures and materials that produce strong magnetoelectric coupling make it possible to provide miniaturized antennas with higher efficiency and broader bandwidth.

Conventional antennas also face the limitation of the so-called ground plane effect, as illustrated in FIG. 1. A ground plane is a flat or nearly flat horizontal conducting surface 115, which can also be the human body. Imaging currents flowing in the opposite directions shown in 109 of planer antennas can cancel out the radiation from the antennas. Traditionally, the radiation is enhanced only when antennas are vertical and perpendicular to the surface, such as the vertical quarter quarter-wave dipole shown in 107, where the imaging current serves as part of an antenna with in-phase radiation. As in illustration 111, ME antennas use magnetic currents for radiation instead of electric currents. As illustrated by 101, 103, and 105, with magnetic/ferroelectric thin film heterostructures as resonators, ME antennas can radiate electromagnetic waves generated by voltage-induced acoustic waves and sense the magnetic fields generated by electromagnetic waves to induce voltages. ME-antennas in-phase imaging current will provide gain enhancement while attaching the ground. This ground plane immunity property can provide a variety of device designs for metallic surfaces and human bodies, which are also considered a ground plane.

COMSOL MULTIPHYSICS Direct Magnetoelectric Coupling Simulation

Figures 2A, 2B:
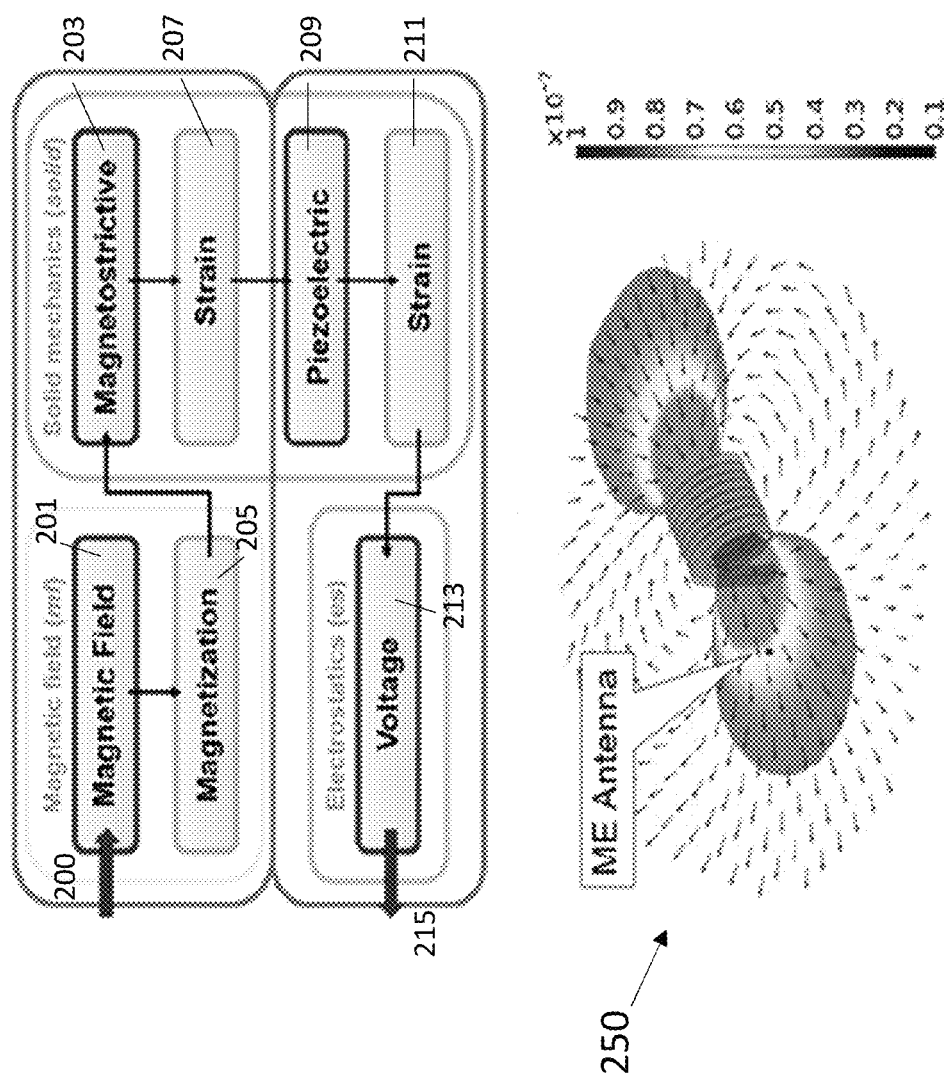
FIGS. 2A and 2B schematically shows the receiving mechanism near field simulation physics flow of an ME-antenna making use of the direct magnetoelectric coupling phenomena in accordance with this application.

The ME coupling effects between the magnetic, elastic, and electric fields in two different magnetostrictive and piezoelectric materials were simulated using the finite element method (FEM) by COMSOL MULTIPHYSICS software. As shown in FIG. 2A, simulations calculate magnetic field 201 and magnetization 205 in response to incoming frequency 200, solid mechanics in response to magnetization 205 that include magnetostrictive 203, the produced strain 207, piezoelectric materials 209, and its produced strain 211. The simulation then calculates the induced voltage 215 in electrostatics modules 213 in response to the piezoelectric materials produced strain 211. The induced voltage simulation setup for a magnetoelectric nanoplate resonator (NPR) is illustrated in FIG. 2B under the RF field (HRF) that is generated by an RF coil.

In the air phase, it is assumed that a spatially uniform, sinusoidal wave magnetic field is applied. The air model space is truncated by an infinite element domain region. When using the infinite element domain features, the outside boundary conditions of the modeling do not affect the solutions.

In the magnetostrictive material, the magnetic permeability and the magnetostrictive strain show a nonlinear dependency on the magnetic flux and the mechanical stress/strains in the ME composite. The constitutive equation of the magnetostrictive is shown as:

$$B=\mu_0[H+M(H,S_{me})+M_r] \quad (1)$$

where B and $M_r$ are the magnetic flux density and the remnant magnetization, respectively; The dynamic magnetization M is related to H and $S_{me}$ which represent the magnetic field and the mechanical stress, respectively. Assuming the magnetic material is isotropic, the magnetostrictive strain $\varepsilon_{me}$ is modeled as the following quadratic isotropic form of the magnetization field M:

$$\varepsilon_{me} = \frac{3}{2}\frac{\lambda_s}{M_s^2}dev(M \otimes M) \quad (2)$$

where for FeGaB, the magnetostrictive coefficient is $\lambda_s$ and the saturation magnetization is $M_s$ are respectively 70 ppm and 1114084 A/m from experiment measures.

In the piezoelectric material, it is assumed that a small signal behavior described by the linear piezoelectric material model applies, in which it is established constitutive relations in a strain-charge form. Piezoelectric tensors and mechanical properties were obtained from COMSOL MULTIPHYSICS built-in modules. The relation between the stress, electric field, and the electric displacement field in a stress-charge form is given by the piezoelectric constitutive equations:

$$\sigma=c\varepsilon-Ee \quad (3)$$

$$D=c\varepsilon+\kappa E \quad (4)$$

where $\sigma$ and $\varepsilon$ are the stress and strain tensors; E and D are the electric field and electric flux density; c, e, and $\kappa$ are the stiffness, strain to electric field coupling constant, and permittivity, respectively. The solid mechanics model shown in FIG. 2A is described by the elastic constitutive relations:

$$\varepsilon=1/2[(\nabla u)^T+\nabla u] \quad (5)$$

$$\sigma=C\varepsilon \quad (6)$$

$$\nabla\sigma=-\rho\omega^2 \quad (7)$$

where u is the displacement, p is the density, w is the angular frequency, and is C the elasticity matrix.

COMSOL MULTIPHYSICS magnetostriction and piezoelectric simulation modules are widely used and reliable in the resonance mode of the device using a magnetostatic approximation in the near-field regime for observing ME coupling. Simulations may not be able to capture the real physics which contain many boundary conditions and anisotropic materials parameters. For example, the magnetomaterial FeGaB layer in the ME antenna shows a highly anisotropic Young's modulus with a large ΔE effect of 160 GPa along the in-plane magnetic hard axis direction, which is very hard to incorporate into any existing model such as COMSOL.

ME Antenna Design

Figure 3:
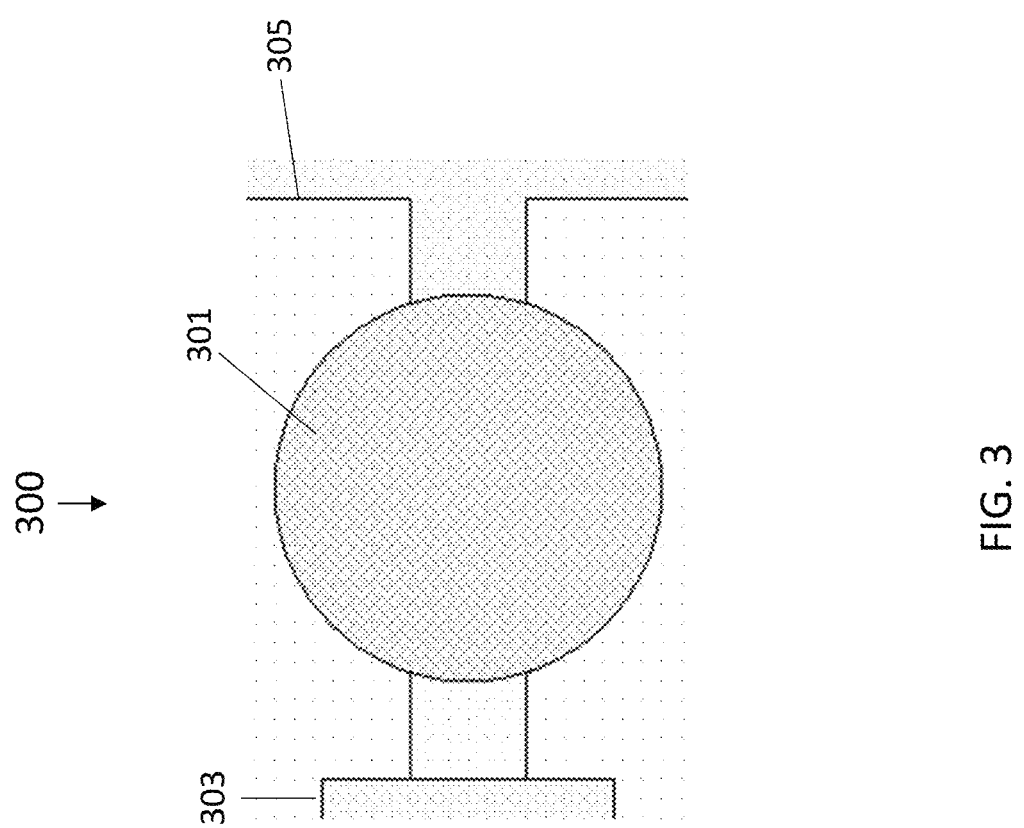
FIG. 3 schematically shows a top sectional view of an ME-antenna with a single resonator in accordance with this application.

In reference to FIG. 3, a top sectional view of an ME antenna 300 comprising one magnetic/ferroelectric thin film heterostructure resonator is shown. 301 represents a disk-shaped magnetic/ferroelectric thin film heterostructure resonator, 303 and 305 represent the gold layer on the piezoelectric filmed substrate layer. Resonators include FBAR, NPR, or SMR type of resonators.

Figure 4:
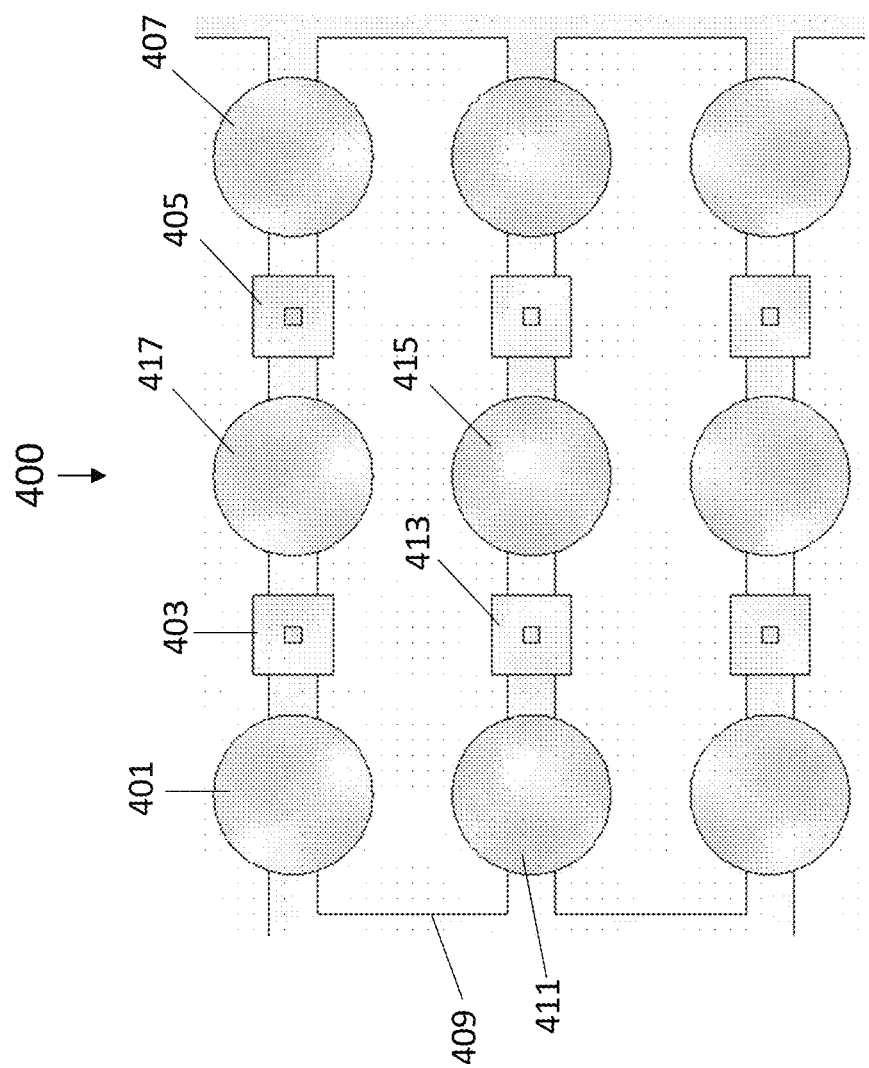
FIG. 4 schematically shows a top sectional view an ME-antenna with an array of resonators in accordance with this application.

In reference to FIG. 4, a top sectional view of an ME antenna 400 (antenna array) comprising multiple magnetic/ferroelectric thin film heterostructure resonators 401, 417, 407, 411, 415 etc. electronically connected in series (through 403, 405 and 413 metal connection) and in parallel (through 409 metal connection). The number of resonators connected in parallel and the number of resonators connected in series are determined by impedance match for a particular device and frequencies. Resonators include FBAR, NPR, or SMR type of resonators.

Figure 5:
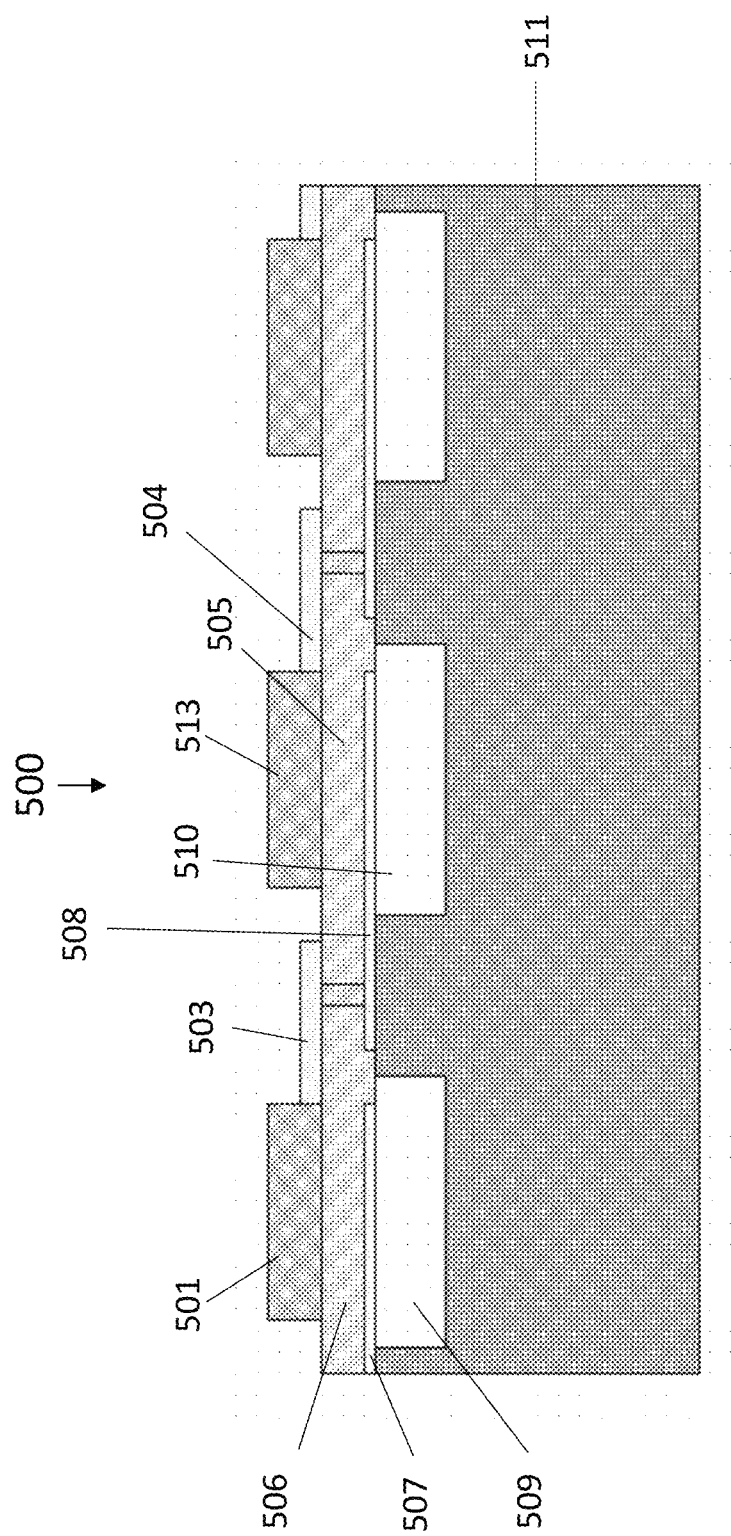
FIG. 5 schematically shows a cross-sectional view an ME-antenna with an array of Thin-Film Bulk Acoustic Resonators (FBAR) and Nano-Plate Resonators (NPR) in accordance with this application.

In reference to FIG. 5, a cross-sectional view 500 of an antenna array comprising multiple magnetic/ferroelectric thin film heterostructure resonators is shown. 501 and 513 respectively represent the magnetic layers of two resonators connected in series. 503 and 504 respectively represent the ground metal layer (preferably made of gold) of the two resonators connected in series. 505 and 506 respectively represent the piezoelectric layer (preferably Aluminum Nitride Scadium Nitride) of the two resonators connected in series. 507 and 508 respectively represent the electrode (preferably platinum) of the two resonators connected in series. 509 and 510 respectively represents the air cavities constructed under the resonators and above the substrate material (for example, silicon) 511. The air cavities underneath the electrode allow each resonator to resonate freely, so that the antenna can respond to radio frequencies by resonating in both the in-plane direction and the out-plane direction. Resonators include FBAR, NPR resonators.

Figure 6:
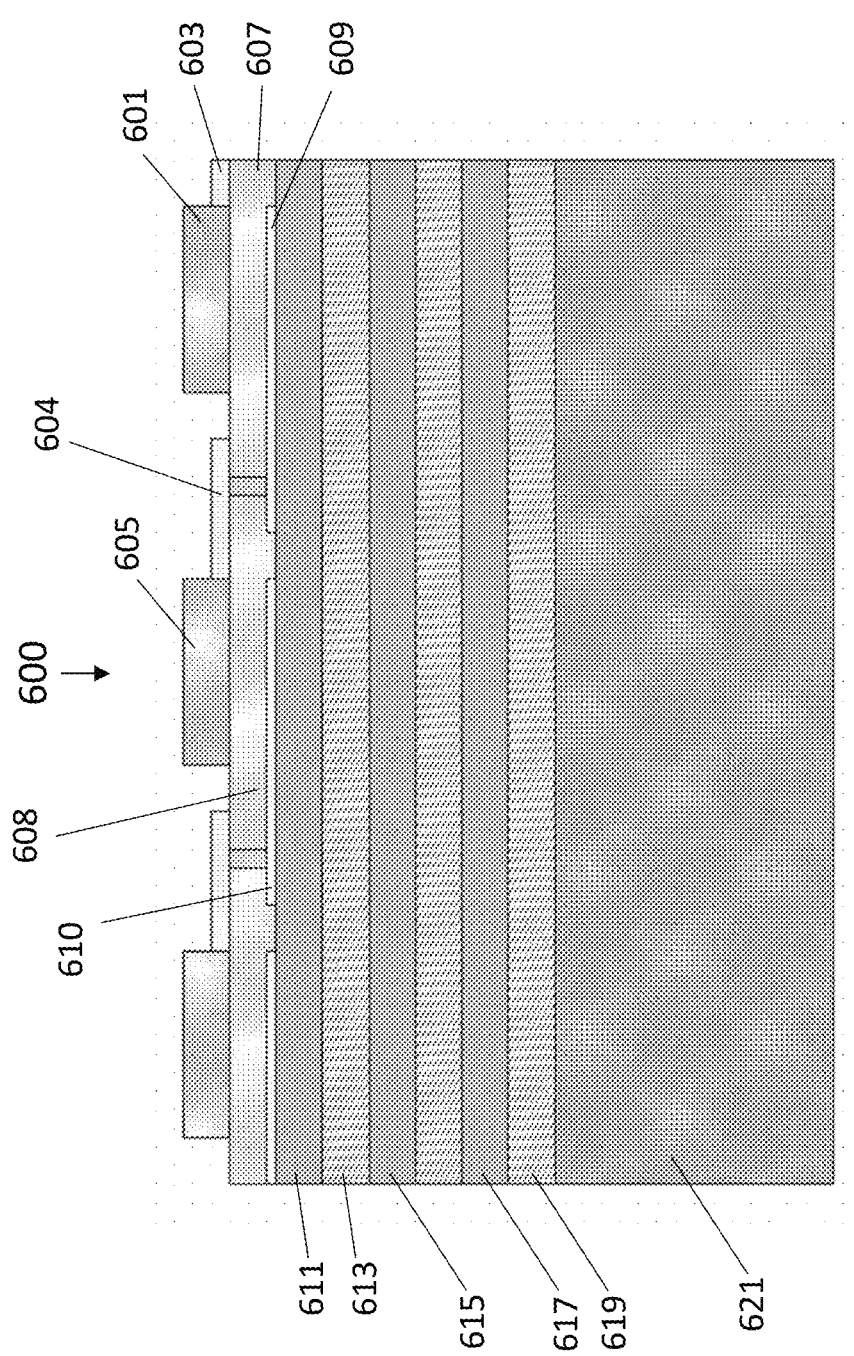
FIG. 6 schematically shows a cross-sectional view n ME-antenna with an array of Solidly Mounted Resonator (SMR) in accordance with this application.

In reference to FIG. 6, a cross-sectional view 600 of an antenna array comprising multiple magnetic/ferroelectric thin film heterostructure SMR resonators is shown. 601 and 605 respectively represent the magnetic layers of two SMR resonators connected in series. 603 and 604 respectively represent the ground metal layer (preferably made of gold) of the two resonators connected in series. 607 and 608 respectively represent the piezoelectric layer (preferably Aluminum Nitride Scadium Nitride) of the two resonators connected in series. 609 and 610 respectively represent the electrode (preferably platinum) of the two resonators connected in series. Both resonators are constructed without the air cavities. To avoid energy leaking, above the silicon substrate 621, multiple additional layers (611-619), preferably 2 to 3 bi-layers, of a low impedance acoustic mirror layer coupled with a high acoustic impedance mirror layer, are constructed underneath the substrate device.

The low acoustic impedance material comprises at least one of the following with acoustic impedance lower than 50 g/cm$^2$-sec×105, such as, Aluminum (Al), Beryllium (Be), Bismuth (Bi), Cadmium (Cd), Cesium (Cs), Columbium (Nb), Copper (Cu), Gallium (Ga), Germanium (Ge), Indium (In), lead, Magnesium (Mg), Manganese (Mn), Plutonium (Pu), Potassium (K), Radium (Ra), Rubidium (Rb), Silver (Ag), Sodium (Na), Thallium (Tl), Thorium (Th), Tin (Sn), Titanium (Ti), Uranium dioxide (UO$_2$), Vanadium (V), Zinc (Zn), Zirconium (Zr), PMMA, quartz, Silicon dioxide (SiO$_2$), nano-porous methyl silsesquioxane (MSQ), nano-porous hydrogensilsesquioxane (HSQ), nano-porous mixtures of MSQ and HSQ, aerogel, etc. and also some piezoelectric materials such as Barium titanate (BaTiO$_3$), Gallium arsenide (GaAs), Lithium niobate (LiNbO$_3$), and Zinc oxide (ZnO), or the combination thereof. The thickness of the individual layer of the low acoustic impedance material is fixed to be one-quarter or one-half mechanical wavelength of the resonant frequency of the piezoelectric resonator.

The high acoustic impedance mirror layer comprises a material of high acoustic impedance higher than 50 g/cm$^2$-sec×105, such as, Gold (Au), Molybdenum (Mo), Nickel (Ni), Platinum (Pt), Tantalum (Ta), Tungsten (W), Uranium (U), diamond-like carbon (DLC), Silicon doped diamond-like carbon (Si-DLC), etc. and also some piezoelectric materials such as Aluminum Nitride (AlN), Boron nitride (BN), Gallium nitride (GaN), and Silicon carbide (SiC), or the combination thereof. The thickness of the individual layer of high acoustic impedance material is fixed to be one-quarter or one-half mechanical wavelength of the resonant frequency of the piezoelectric resonator.

In the antenna comprising multiple resonators, the electrodes of the first and second resonators are respectively deposited with a material comprising at least one of the following: Molybdenum (Mo), Titanium (Ti), Tungsten (W), Gold (Au), Platinum (Pt) and Aluminum (Al), Ru (Ruthenium), or the combination thereof.

The piezoelectric layer is a material comprising at least one of the following: Aluminum Nitride Scadium Nitride (AlScN), Aluminum Nitride (AlN), (Hf,X) O$_2$ with X=Zr, Si, or the like, Barium titanate (BaTiO$_3$), Gallium phosphate (GaPO$_4$), Lanthanum gallium silicate (LGS), Lead scandium tantalate (PST), Zinc oxide (ZnO), Quartz, Lead zirconate titanate (PZT), Lithium tantalate (LiTaO$_3$), Lead lanthanum zirconate titanate (PLZT), Bismuth ferrite (BFO), Lead magnesium niobate-lead titanate (PMN-PT), Lead-zinc niobate lead titanate (PZN-PT), Polyvinylidene fluoride (PVDF, PVDF(-TrFE)), Sodium bismuth titanate (NBT), or the combination thereof.

The magnetic layer is a material comprising at least one of the following: metals such as Iron (Fe), Nickel (Ni), Cobalt (Co), etc., alloys such as Iron gallium (FeGa), Iron gallium alloy (FeGaX with X=B, C, or the like), Iron cobalt (FeCo), Iron cobalt alloy (FeCoX with X=B, C, V, or the like), Metglas, Iron cobalt silicon boron (FeCoSiB), Nickel iron (NiFe), Nickel iron alloy (NiFeX with X=Cu, Zn, Co, Mn, V, Al, Ta, Ru, etc.), Nickel molybdenum alloy, Iron silicon alloy, Cobalt platinum alloy, Terfenol and Terfenol-D (TbxDy$_{1-x}$Fe$_2$), etc., and spinel ferrites such as Nickel ferrite, Nickel zinc ferrite, Cobalt ferrite, Barium ferrite, Nickel zinc-aluminum ferrite, Manganese zinc ferrite, Strontium ferrite, Lithium ferrite, and hexaferrite, or the combination thereof.

Micro-Fabrication.

ME-antennas utilize the nanoelectromechanical system (NEMS) antennas based on the strong ME coupling between EM and bulk acoustic waves in the resonant ME heterostructures (ferromagnetic/piezoelectric). The antenna consists one layer of piezoelectric material and one layer of magnetostrictive material, and it is based on the bulk acoustic wave (BAW) resonator to transfer the dynamic strain across different layers.

For simplicity, the micro-fabrication of a single resonator is repeated from the prior patent application. In reference to FIG. 7A and FIG. 7B, a 3D nano-plate resonator (NPR) and a thin film bulk acoustic resonator (FBAR) based antenna structures are shown with the excitation and vibration direction. Both NPR and FBAR have the same excitation but with different resonance modes, which provide a variety of frequency coverages.

Figure 7A:
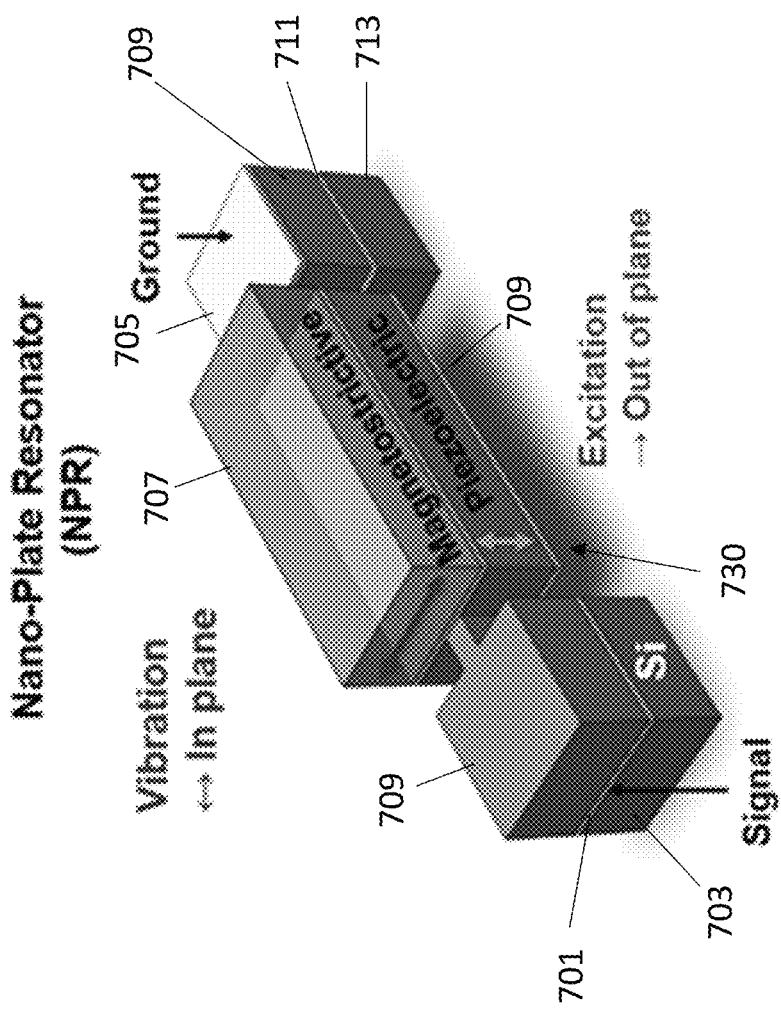
FIG. 7A shows a 3D structure of an example ME-antenna with a NPR resonator in accordance with this application.
Figure 7B:
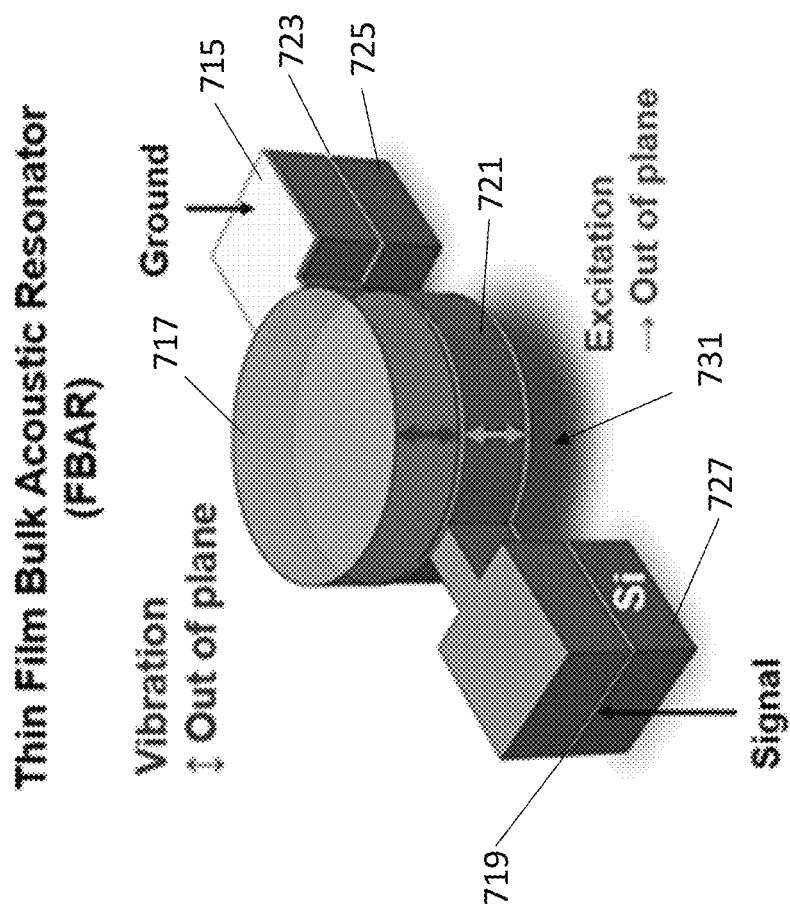
FIG. 7B shows a 3D structure of an example ME-antenna with a FBAR resonator in accordance with this application.

For both the NPR and the FBAR based antennas shown in FIG. 7A and FIG. 7B, the fabrication process starts respectively with a high resistivity silicon (Si) wafers 703 and 713 or 727 and 725. A layer of Platinum (Pt) film 701 and 711 or 719 and 723 was sputter-deposited and patterned by lift-off on top of the Si substrate 703 and 713 or 727 and 725 to establish the bottom electrodes. Layer of the Aluminum Nitride (AlN) film 709 or 721 was sputter-deposited, and vias were etched by H$_3$PO$_4$ to access the bottom electrodes 701 or 719. After that, the AlN film was etched by inductively coupled plasma (ICP) etching in Cl$_2$ based chemistry to define the shape of the resonant nano-plate. Next, the gold (Au) film was evaporated and patterned by lift-off to form the top ground 705 or 715. Finally, the FeGaB/Al$_2$O$_3$ multilayer layer 707 or 717 was deposited by a magnetron sputtering and patterned by lift-off. A 7960 A/m (100 Oe) in-situ magnetic field bias was applied during the magnetic deposition perpendicular to the anchor direction of the device to pre-orient the magnetic domains. Then, the structure was released by XeF$_2$ isotropic etching of the silicon substrate to minimize the substrate clamping effect. An air cavity 730 or 731 underneath the FeGaB/Al$_2$O$_3$-Pt electrode layer was constructed to allow piezoelectric vibration.

Figure 8:
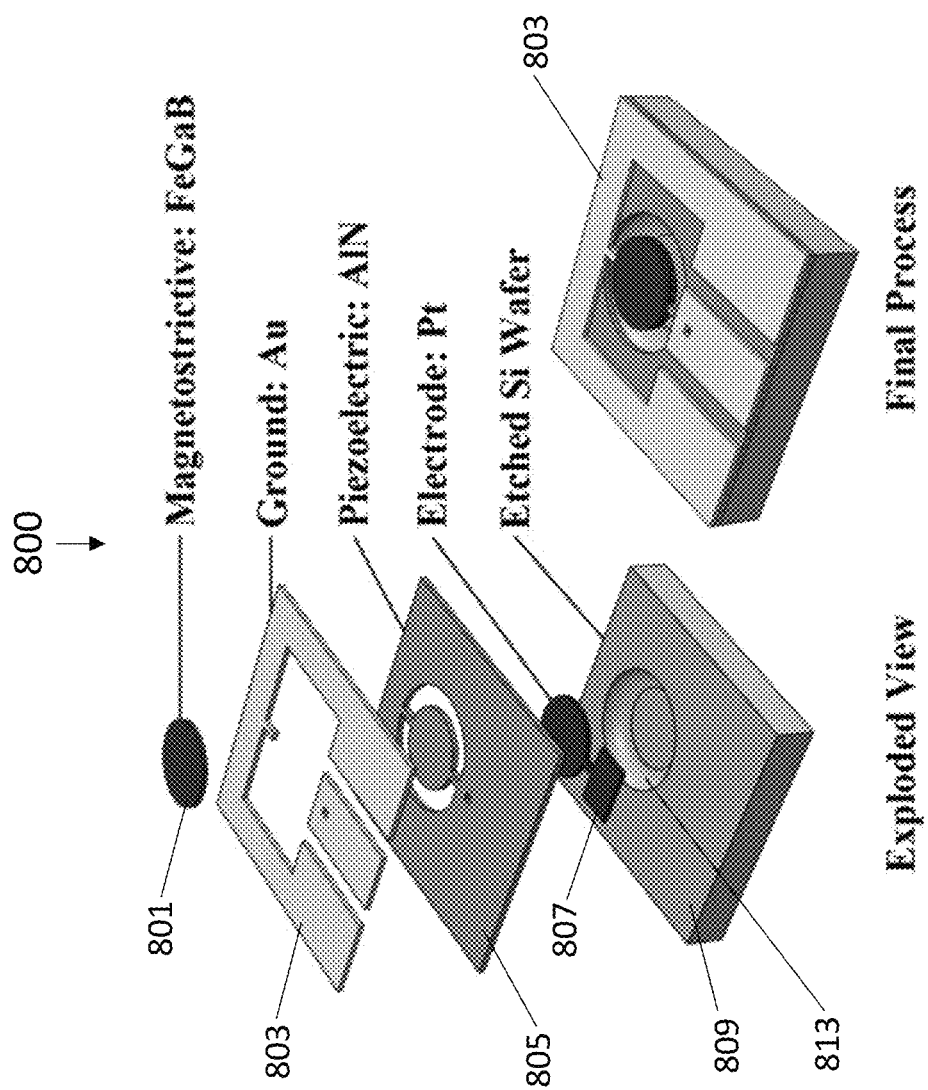
FIG. 8 shows an exploded view of an assembly process of an example ME-antenna with a FBAR resonator in accordance with this application.

Both nano-plate resonator (NPR) and thin-film bulk acoustic wave resonator (FBAR) devices provide the integrated capability to CMOS technology and use the same five-mask micro-fabrication process. FIG. 8 shows an exploded view of the multiple layers: from bottom up, the etched silicon wafer 809, platinum electrode 807, AlN piezoelectric layer with matching shape 805, the Au ground layer 803, and FeGaB magnetostrictive layer 801. The multi-array structures shown in FIG. 5 were similarly built. The silicon wafer substrates were etched into multiple air cavities, and adjacent electrodes were either connected in series or parallel in terms of connecting to a signal source. For SMR resonator arrays shown in FIG. 6, without etching and releasing process, additional multiple alternating low acoustic impedance material layers and high acoustic impedance material layers were added to underneath the device and above the silicon substrate.

The FeGaB/Al$_2$O$_3$ multilayers were measured with a magnetic coercive field <400 A/m (0.5 mTesla) by vibration sample magnetometer (VSM) indicates a soft magnetic property, but a large magnetostriction constant of 70 ppm was measured. FMR spectrum taken at 9.5 GHz of FeGaB/Al$_2$O$_3$ multilayers gives a resonance frequency of 93 mT and magnetic moment of 1.15 T based on the Kittel equation. The resonance linewidth of 4780 A/m (6 mTesla) measured by ferromagnetic resonance spectroscopy was also obtained, demonstrating a good microwave property with a low magnetic loss.

Simulated Displacement Profile

Figure 9A:
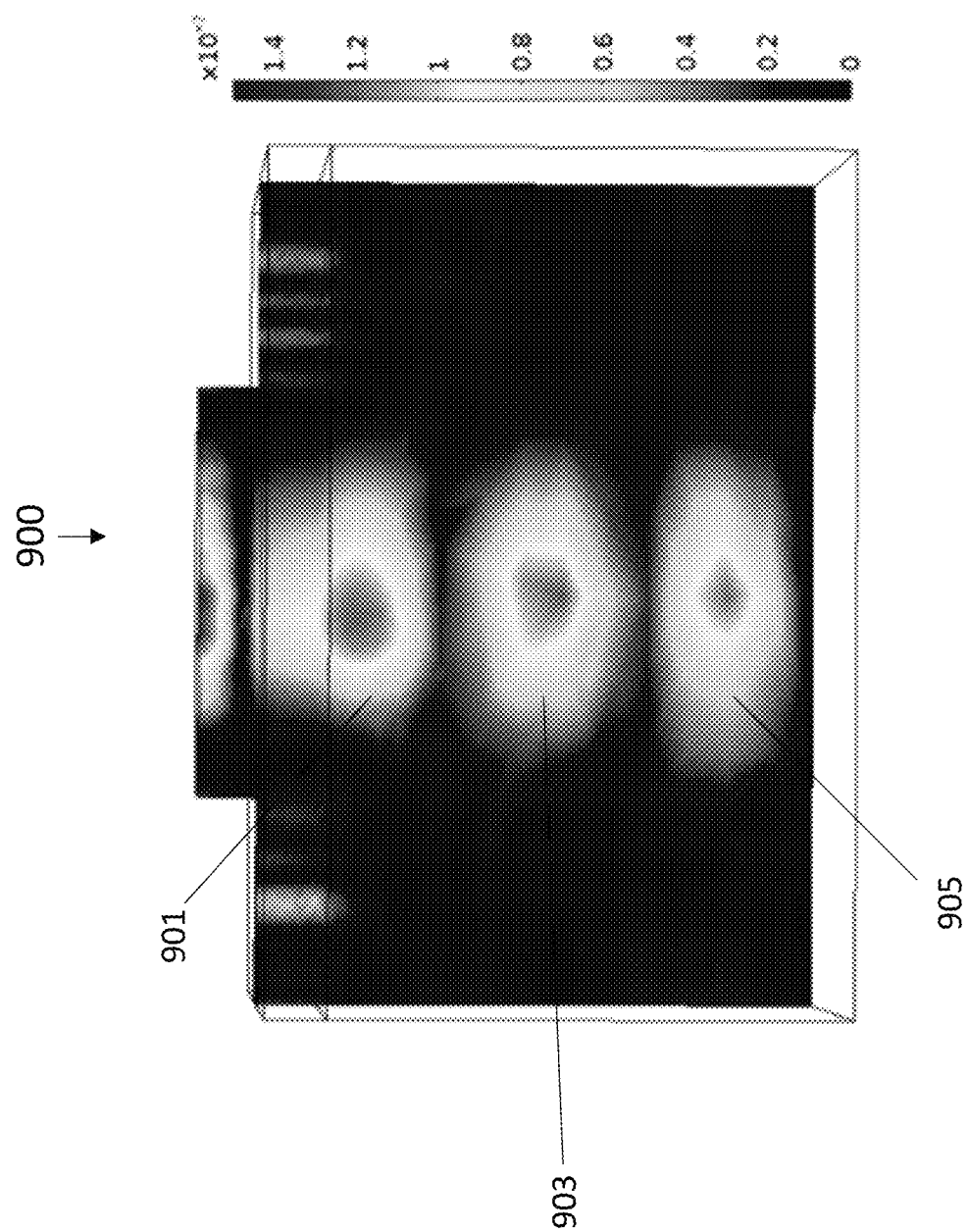
FIG. 9A shows a simulated displacement profile of a magnetoelectric (ME) resonator on silicon at resonance in accordance with this application.
Figure 9B:
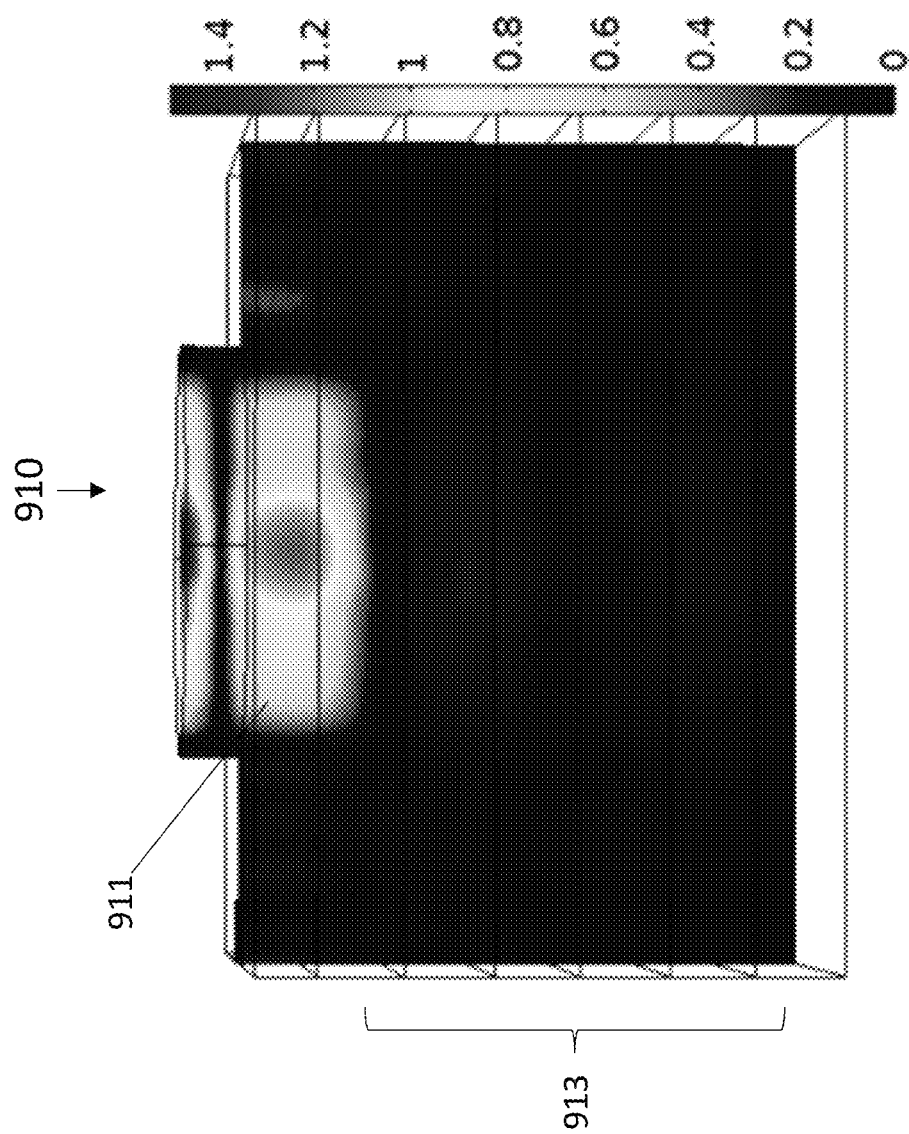
FIG. 9B is the simulated displacement profile of the magnetoelectric (ME) resonator on acoustic mirror layers at resonance in accordance with this application.

In reference to FIGS. 9A and 9B, Simulated Displacement Profiles of excitation of resonators are shown. Resonators without the acoustic mirror layer, acoustic energy (901,903 and 905, FIG. 9A) was leaked into the substrate layer while the SMR resonators having multiple additional alternating low acoustic impedance material layers and high acoustic impedance material layers added underneath the resonator and above the silicon substrate showed no energy leak into the silicon substrate—the 913 area shows no or very little acoustic energy leakages in the substrate, all energy remained only in the resonator 911 area.

Induced Voltage

Figure 10:
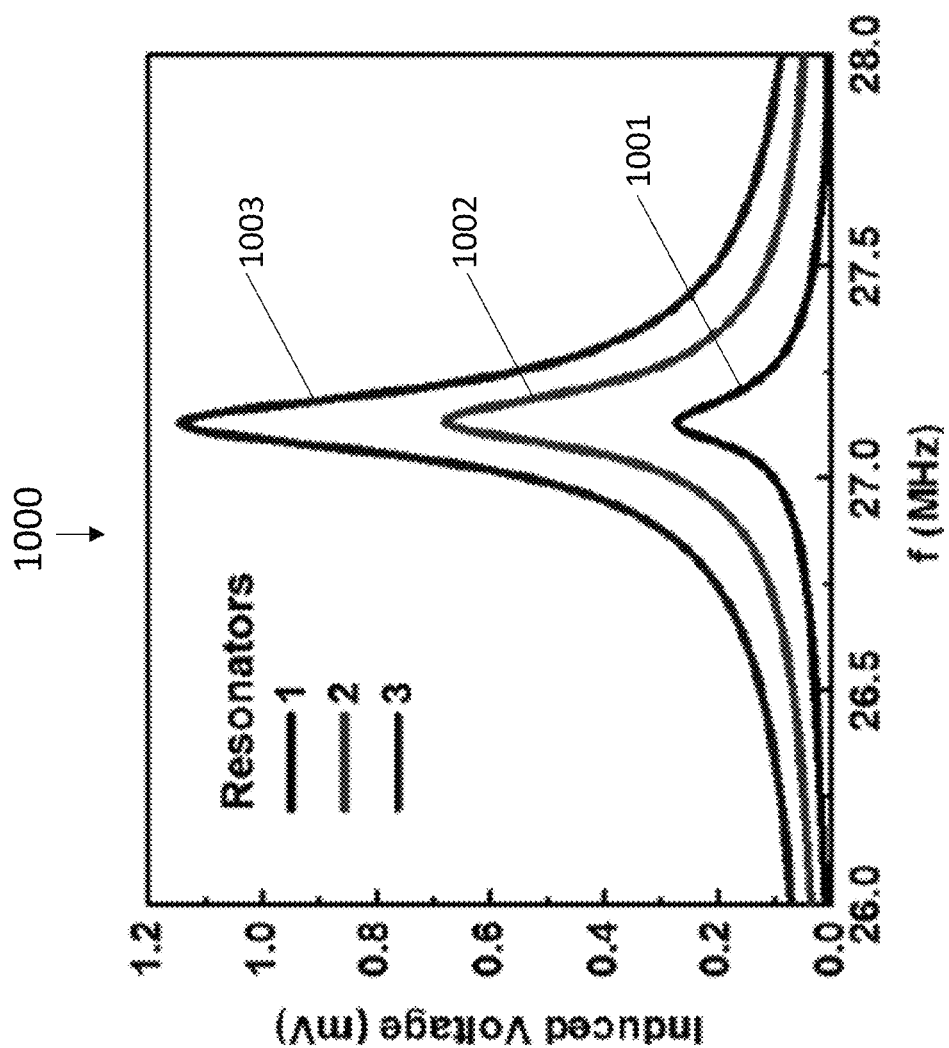
FIG. 10 are plots of the simulated induced voltages from an example magnetoelectric (ME) antenna array with one to three resonators arrays in series, in accordance with this application.

Under HRF excitation with an amplitude of about 60 nT (Wb/m2) from an RF coil along the length direction of the resonator, the simulated induced ME voltage output was calculated. FIG. 10 shows plots of the simulated induced voltages from magnetoelectric (ME) antennas comprising one to three resonator arrays connected in series. The inset shows the simulated in-plane displacement of the ME resonator excited by the HRF at resonance. Antennas having multiple resonators in an array show a synergic effect in producing induced voltage; the induced voltage curve 1003 in the antenna comprising three resonators shows a much higher induced voltage than the induced voltage curve 1002 with two resonators and the induced voltage curve 1001 with one resonator.

Reflection Coefficient ($S_{11}$), and Transmission Coefficient ($S_{21}$)

The antenna transmission behaviors of the ME antenna and resonator array antennas were tested in a far-field configuration at GHz range in an anechoic chamber. For small antennas that dimension is shorter than half of the wavelength, the far-field region can be considered at >2×wavelengths. A calibrated linear polarization standard horn antenna and an ME-based antenna with a diameter of 550 μm (Magnetic disk diameter of 200 μm) are connected to port 1 and 2 of a network analyzer, respectively for antenna measurements.

Figure 11:
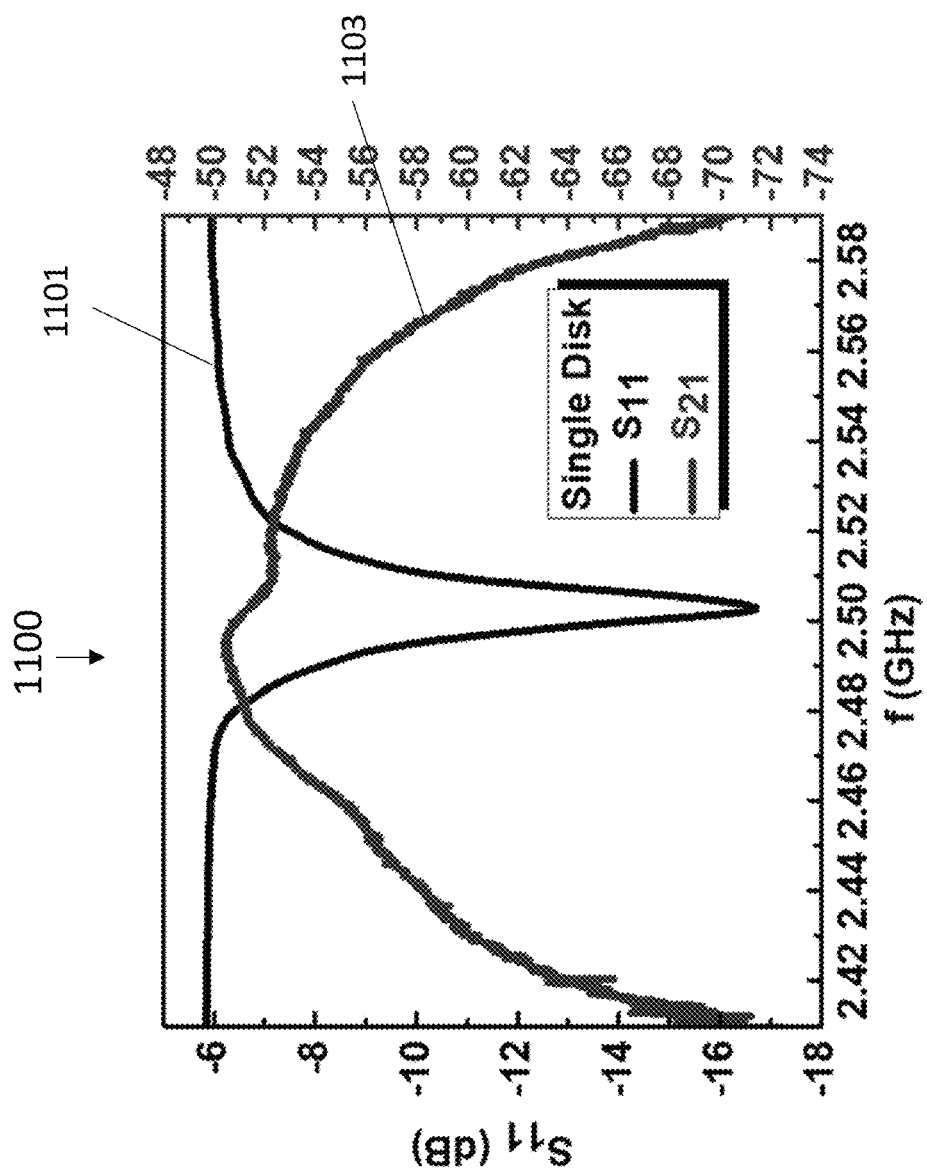
FIG. 11 are plots of measured reflection coefficient ($S_{11}$), and the transmission ($S_{21}$) between the single-disk resonator magnetoelectric (ME) antenna and the receiving horn antenna in accordance with this application.
Figure 12:
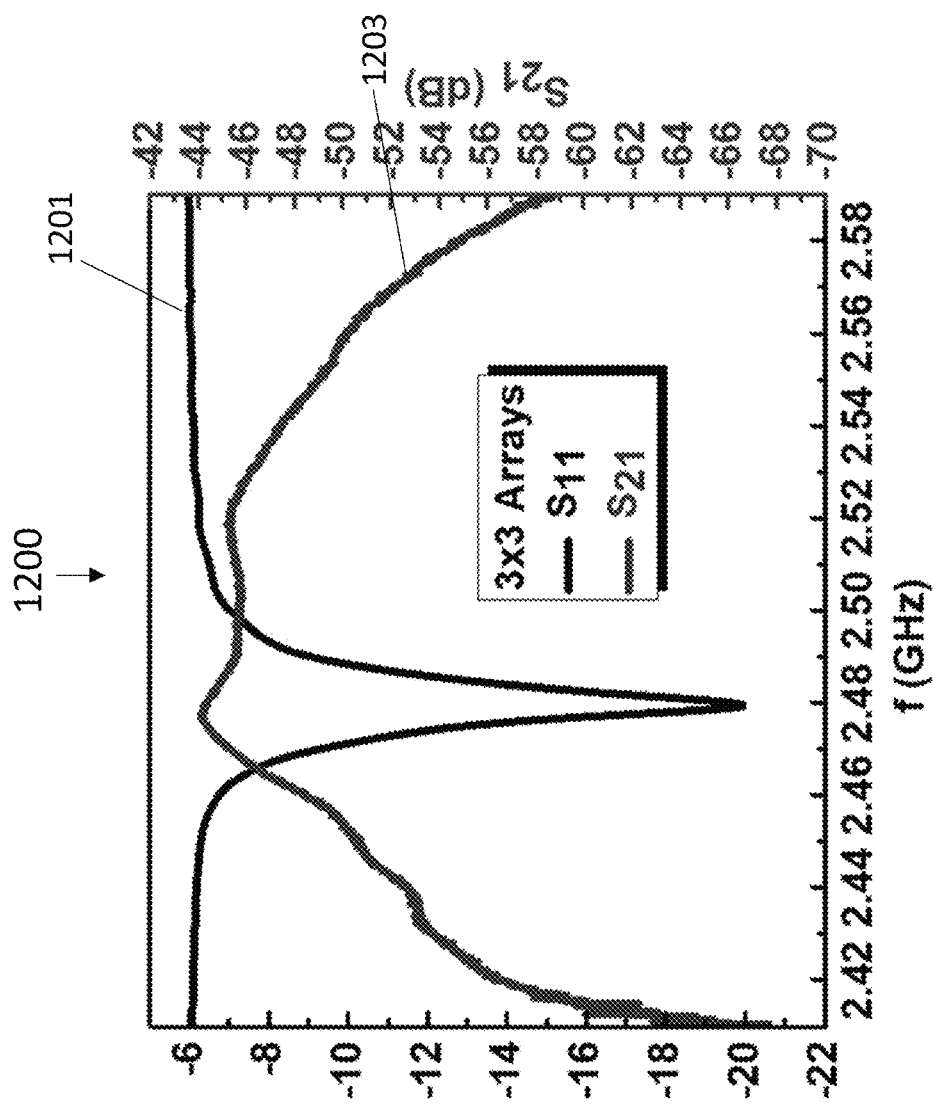
FIG. 12 are plots of measured reflection coefficient ($S_{11}$), and the transmission ($S_{21}$) between the three-by-three single-disk resonators magnetoelectric (ME) antenna array and the receiving horn antenna in accordance with this application.
Figure 13:
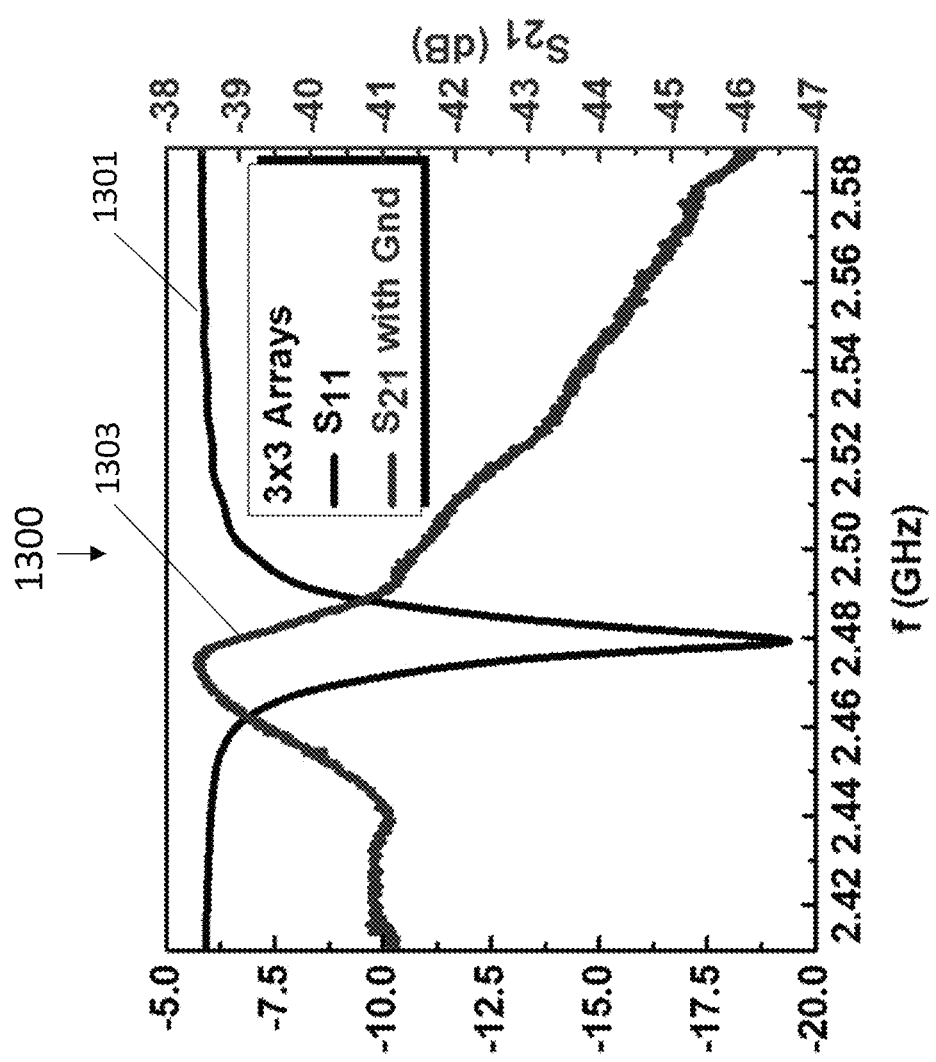
FIG. 13 are plots of measured reflection coefficient ($S_{11}$), and the transmission ($S_{21}$) between the three-by-three single-disk resonators magnetoelectric (ME) antenna array sitting on a large metallic ground plane and the receiving horn antenna in accordance with this application.

FIG. 11 shows the measured reflection coefficient ($S_{11}$), and the transmission ($S_{21}$) between a single-disk resonator magnetoelectric (ME) antenna and the receiving horn antenna; there was a transmission of −50 dB (curve 1103). FIG. 12 shows the measured reflection coefficient ($S_{11}$), and the transmission ($S_{21}$) between a three by three multi-array single-disk resonators magnetoelectric (ME) antenna and the receiving horn antenna; the measured transmisson was −44 dB (curve 1203). FIG. 13 shows measured reflection coefficient ($S_{11}$), and the transmission ($S_{21}$) between a three by three single-disk resonator magnetoelectric (ME) array antenna sitting on a large metallic ground plane and the receiving horn antenna, the measured transmission was −38.2 dB (curve 1303). Again, the multi-array resonator antenna shows a much higher efficiency gain, consistent with the higher induced voltage effect.

Figure 14:
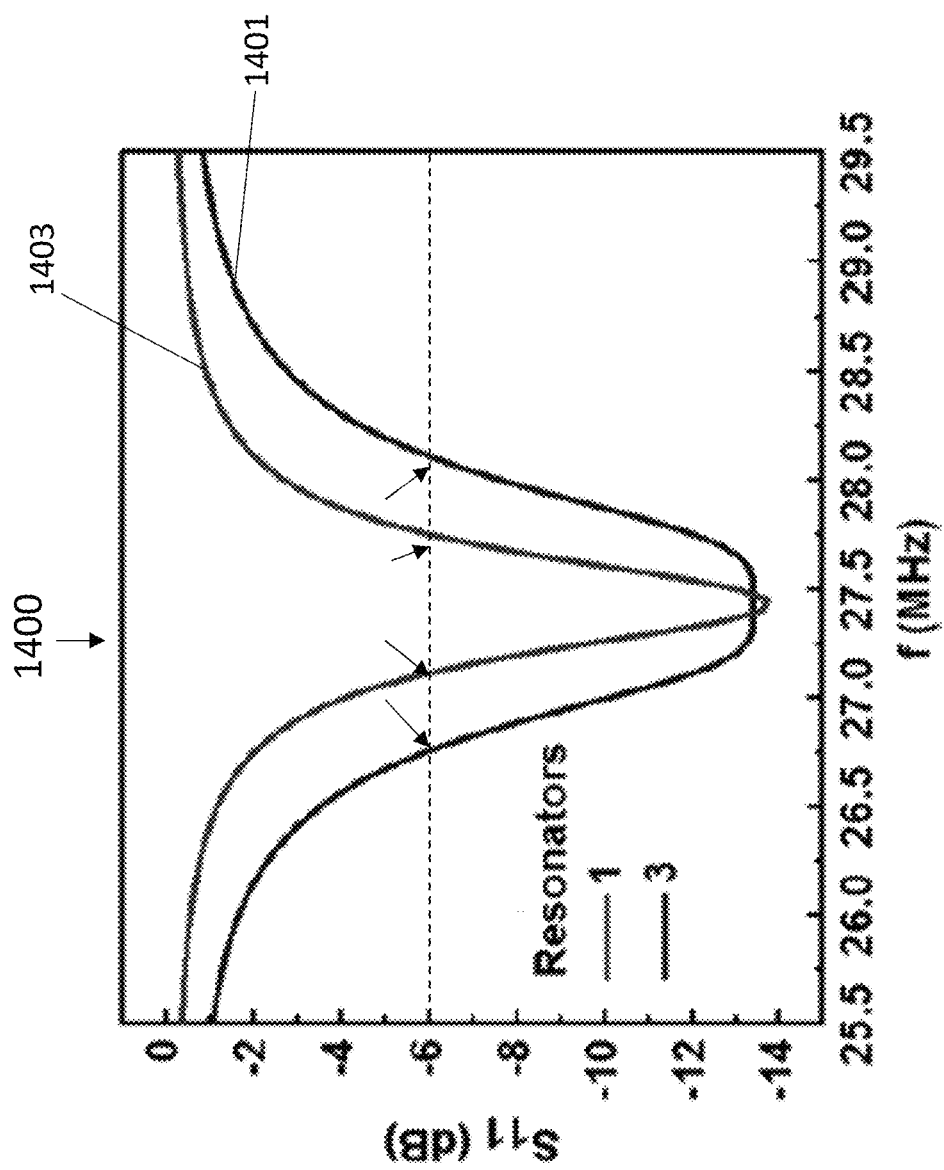
FIG. 14 are plots of the return losses for magnetoelectric (ME) antenna array with one and three resonators arrays in parallel in accordance with this application.

FIG. 14 shows the return losses for magnetoelectric (ME) antenna array with one (1403) and three resonators arrays (1401) connected in parallel. Around −6 dB, the three resonator array shows a much broader peak width, indicating a broader bandwidth capability.

Figure 15:
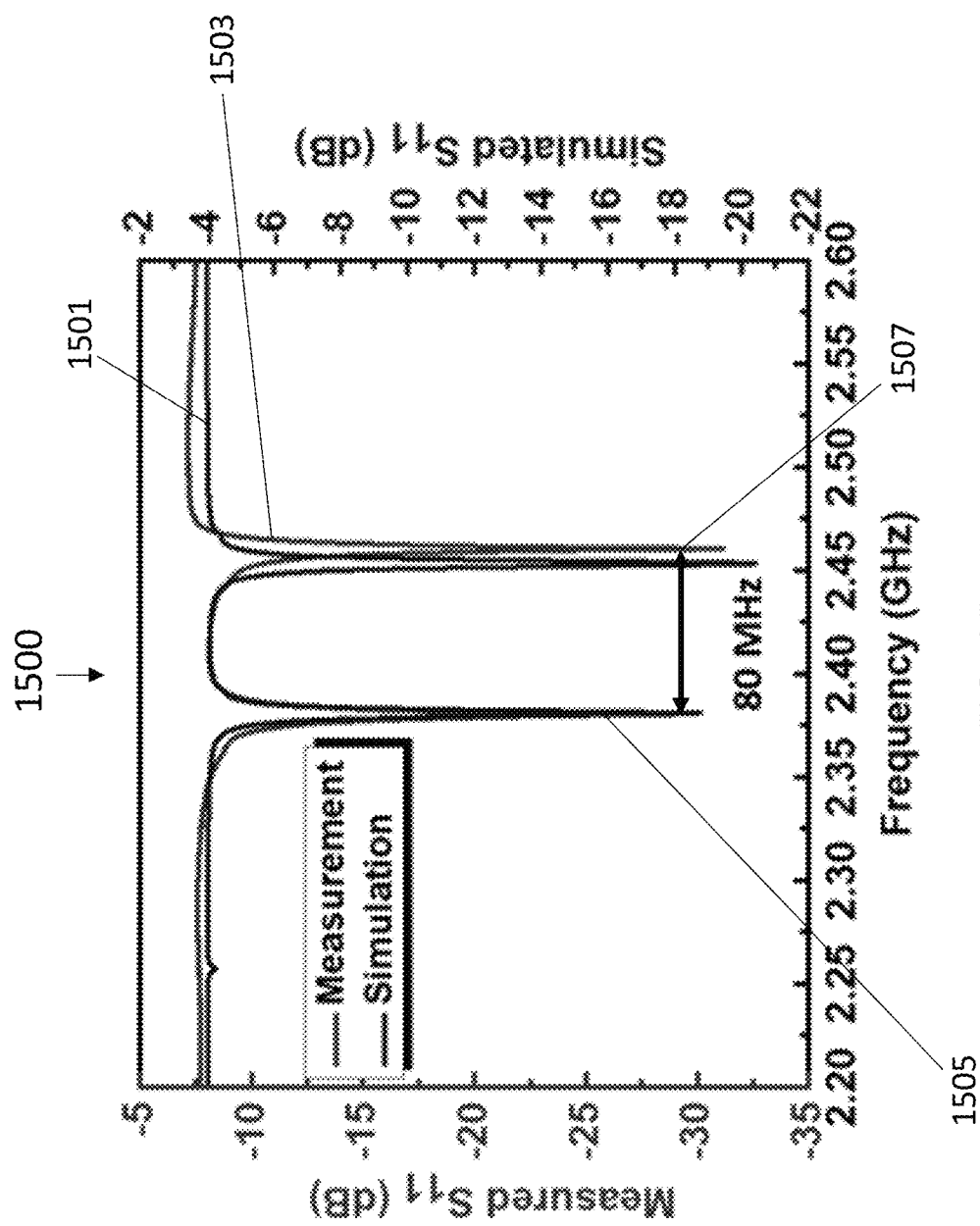
FIG. 15 are plots of the measured reflection coefficient ($S_{11}$), and the simulated reflection coefficient ($S_{11}$) for the magnetoelectric (ME) antenna array with two different resonances in accordance with this application.

FIG. 15 shows a good match between the measured reflection coefficient ($S_{11}$) (1503), and the simulated reflection coefficient (Sn) (1501) for the magnetoelectric (ME) antenna array having two different resonators where there were two distinct peaks 1505 and 1507 that were not overlapped but an 80 MHz difference in responses, showing the capability of broadening the responsive bandwidth.

Figure 16:
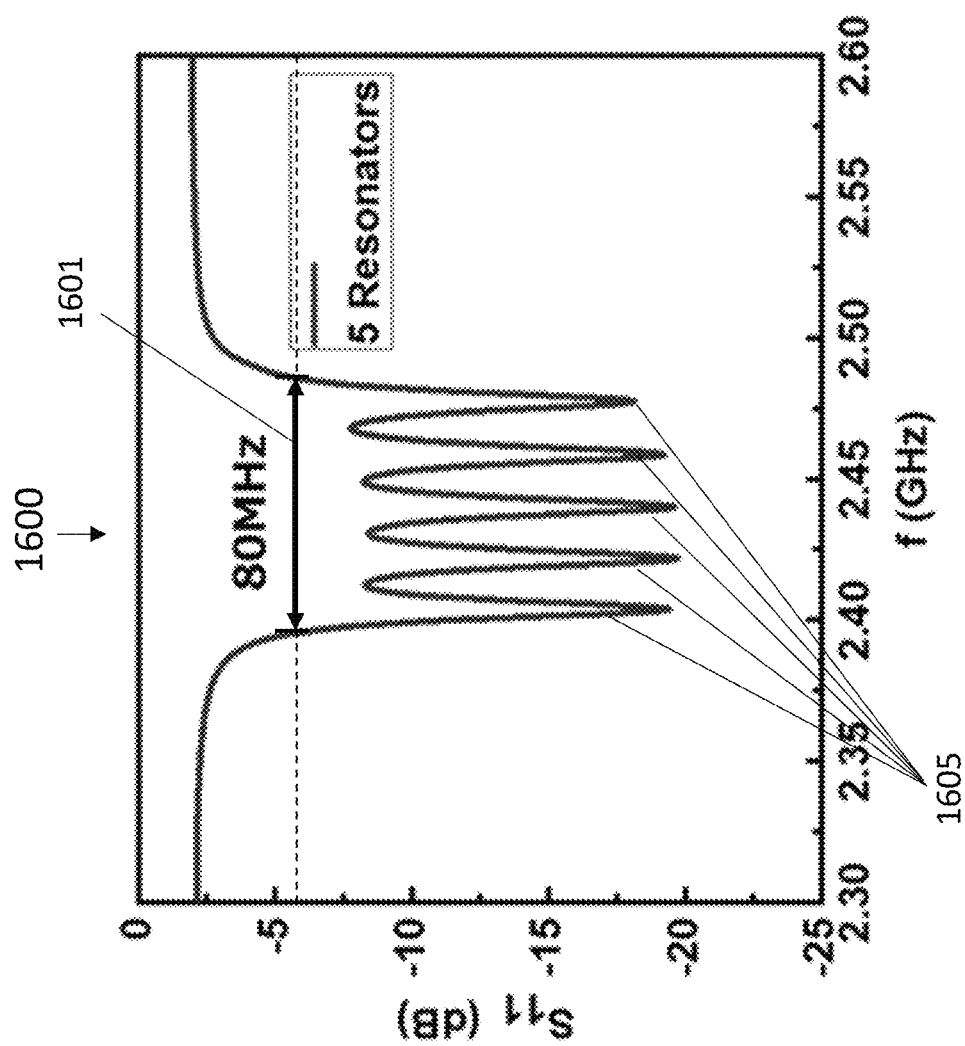
FIG. 16 is a plot of the simulated reflection coefficient ($S_{11}$) for the magnetoelectric (ME) antenna array with five different resonances in accordance with this application.

FIG. 16 is a plot of the simulated reflection coefficient ($S_{11}$) for the magnetoelectric (ME) antenna array with five different resonances (1605) that overlap with each other, thus increased 80 MHz responsive bandwidth (1601) at −6 dB.

Figure 17:
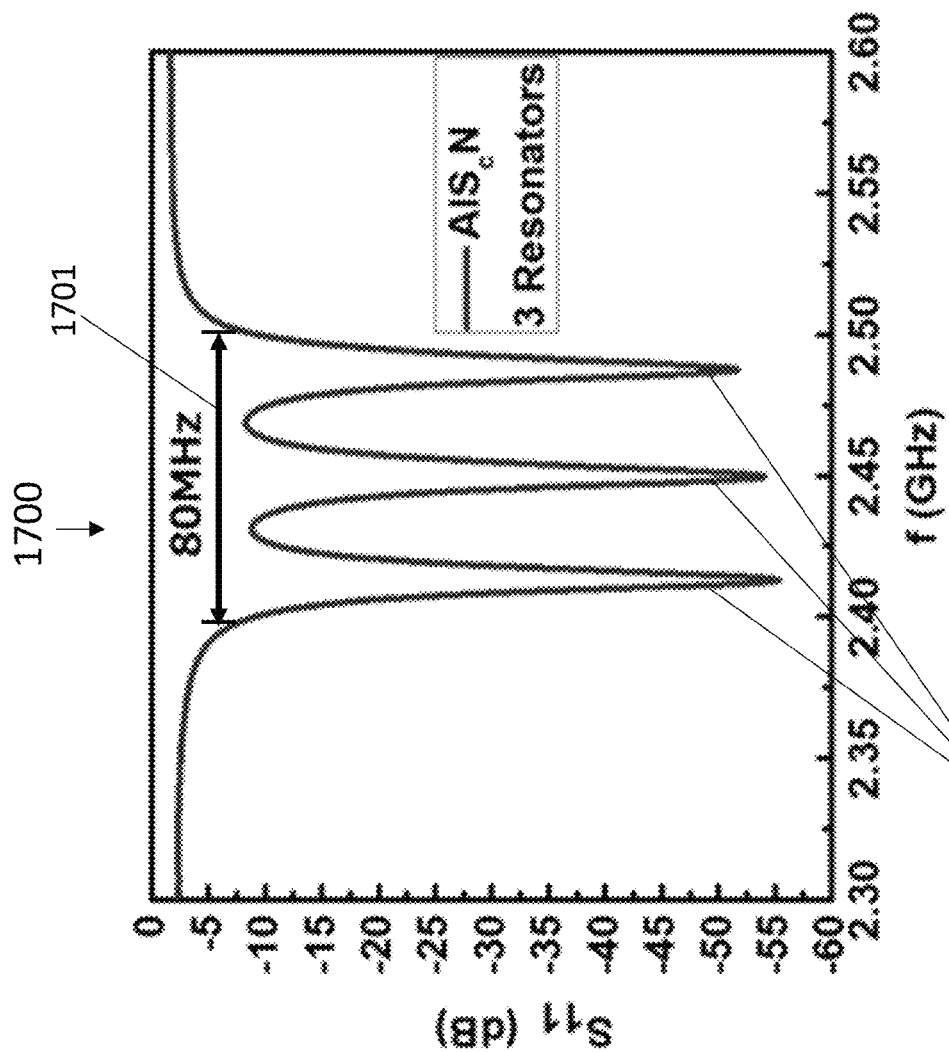
FIG. 17 is a plot of the simulated reflection coefficient ($S_{11}$) for the magnetoelectric (ME) antenna array with three different resonances with replacing the Aluminum Nitride (AlN) to the Aluminum Scandium Nitride (AlScN) in accordance with this application.

FIG. 17 is a plot of the simulated reflection coefficient (Si) for the magnetoelectric (ME) antenna array with three different resonances having Aluminum Scandium Nitride (AlScN) as the piezoelectric layer, three distinct responsive peaks 1703 overlaps, generating an 80 MHz broadened responsive bandwidth (1701).

Having described at least one of the preferred embodiments of the present invention with reference to the accompanying drawings, it will be apparent to those skills that the invention is not limited to those precise embodiments and that various modifications and variations can be made in the presently disclosed system without departing from the scope or spirit of the invention. Thus, it is intended that the present disclosure cover modifications and variations of this disclosure, provided they come within the scope of the appended claims and their equivalents.

Additional general background, which helps to show variations and implementations, may be found in the following publications, all of which are hereby incorporated by reference herein for all purposes:

None of the descriptions in the present application should be read as implying that any particular element, step, or function is an essential element that must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. The claims as filed are intended to be as comprehensive as possible, and NO subject matter is intentionally relinquished, dedicated, or abandoned.

What is claimed:

1. A magnetoelectric (ME) antenna, comprising:
   one or more resonators electronically connected in series or in parallel, each of said resonators having a structure of
   a magnetostrictive layer;
   a top ground electrode layer;
   a piezoelectric layer;
   a bottom electrode layer; and
   a substrate layer;
      wherein said top ground electrode layer is deposited on said piezoelectric layer and is patterned with a shaped aperture; the magnetostrictive layer is also deposited on said piezoelectric layer through the shaped aperture; the piezoelectric layer is deposited on the bottom electrode layer which is deposited on the substrate layer;
      thereby when in use the magnetostrictive layer and the piezoelectric layer form a heterostructure on the bottom electrode layer, leading to magnetization oscillation that radiates electromagnetic waves by an induced acoustic resonance frequency or converts the electromagnetic waves into a piezoelectric voltage output.

2. The ME antenna of claim 1, wherein the electrode layer is deposited with materials comprising at least one of the materials, including Molybdenum (Mo), Titanium (Ti), Tungsten (W), Gold (Au), Platinum (Pt) and Aluminum (Al), and Ru (Ruthenium).

3. The ME antenna of claim 1, wherein the piezoelectric layer comprises a material comprising at least one of the piezoelectric materials selected from Aluminum Scadium Nitride ($AlS_cN$), Aluminum Nitride (AlN), (Hf,X) $O_2$ with X=Zr, Si, etc., Barium titanate ($BaTiO_3$), Gallium phosphate ($GaPO_4$), Lanthanum gallium silicate (LGS), Lead scandium tantalate (PST), Zinc oxide (ZnO), Quartz, Lead zirconate titanate (PZT), Lithium tantalate ($LiTaO_3$), Lead lanthanum zirconate titanate (PLZT), Bismuth ferrite (BFO), Lead magnesium niobate-lead titanate (PMN-PT), Lead-zinc niobate lead titanate (PZN-PT), Polyvinylidene fluoride (PVDF, PVDF(-TrFE)), Sodium bismuth titanate (NBT) and a combination thereof.

4. The ME antenna of claim 1, wherein the magnetostrictive layer comprises a material comprising at least one of the magnetic materials selected from Iron (Fe), Nickel (Ni), Cobalt (Co), Iron gallium (FeGa), Iron gallium alloy with formula FeGaX where X=B, C, Iron cobalt (FeCo), Iron cobalt alloy with formula FeCoX where X=B, C, V, Metglas, Iron cobalt silicon boron (FeCoSiB), Nickel iron (NiFe), Nickel iron alloy with formula NiFeX where X=Cu, Zn, Co, Mn, V, Al, Ta, Ru, Nickel molybdenum alloy, Iron silicon alloy, Cobalt platinum alloy, Terfenol and Terfenol-D ($Tb_xDy_{1-x}Fe_2$), and Nickel ferrite, Nickel zinc ferrite, Cobalt ferrite, Barium ferrite, Nickel zinc-aluminum ferrite, Manganese zinc ferrite, Strontium ferrite, Lithium ferrite, and hexaferrite.

5. The ME antenna of claim 1, wherein if more than one resonator, the plurality of resonators are made of different materials.

6. The ME antenna of claim 1, wherein if a plurality of resonators, at least one resonator is configured with an air cavity below said substrate layer so that the bottom electrode layer area of the resonator is suspended from the substrate layer.

7. The ME antenna of claim 1, wherein if a plurality of resonators, at least one resonator is coupled to an Acoustic Mirror that is configured with multiple layers of alternating low acoustic impedance material layer and high acoustic impedance material layer.

8. The ME antenna of claim 7, wherein the low acoustic impedance material layer comprises at least one material of low acoustic impedance selected from Aluminum (Al), Beryllium (Be), Bismuth (Bi), Cadmium (Cd), Cesium (Cs), Columbium (Nb), Copper (Cu), Gallium (Ga), Germanium (Ge), Indium (In), lead, Magnesium (Mg), Manganese (Mn), Plutonium (Pu), Potassium (K), Radium (Ra), Rubidium (Rb), Silver (Ag), Sodium (Na), Thallium (Tl), Thorium (Th), Tin (Sn), Titanium (Ti), Uranium dioxide ($UO_2$), Vanadium (V), Zinc (Zn), Zirconium (Zr), PMMA, quartz, Silicon dioxide ($SiO_2$), nano-porous methyl silsesquioxane (MSQ), nano-porous hydrogensilsesquioxane (HSQ), nano-porous mixtures of MSQ and HSQ, aerogel, Barium titanate ($BaTiO_3$), Gallium arsenide (GaAs), Lithium niobate ($LiNbO_3$), Zinc oxide (ZnO) and a combination thereof.

9. The ME antenna of claim 7, wherein the high acoustic impedance material layer comprises at least one material of high acoustic impedance Gold (Au), Molybdenum (Mo), Nickel (Ni), Platinum (Pt), Tantalum (Ta), Tungsten (W), Uranium (U), diamond-like carbon (DLC), Silicon doped diamond-like carbon (Si-DLC), etc. and also some piezoelectric materials such as Aluminum Nitride (AlN), Boron nitride (BN), Gallium nitride (GaN), Silicon carbide (SiC) and a combination thereof.

10. A magnetoelectric (ME) antenna, comprising:
at least two resonators electronically connected in series or in parallel, each of said resonators having a structure of
a magnetostrictive layer;
a top ground electrode layer;
a piezoelectric layer;
a bottom electrode layer; and
a substrate layer;
wherein said top ground electrode layer is deposited on said piezoelectric layer and is patterned with a shaped aperture; the magnetostrictive layer is also deposited on said piezoelectric layer through the shaped aperture; the piezoelectric layer is deposited on the bottom electrode layer which is deposited on the substrate layer, said substrate layer is configured with an air cavity below, so that the bottom electrode layer area of the resonator is suspended from the substrate layer;

thereby when in use the magnetostrictive layer and the piezoelectric layer form a heterostructure on the bottom electrode layer, leading to magnetization oscillation that radiates electromagnetic waves by an induced acoustic resonance frequency or converting the electromagnetic waves into a piezoelectric voltage output.

11. The ME antenna of claim 10, wherein the electrode layer is deposited with materials comprising at least one of the materials selected from Molybdenum (Mo), Titanium (Ti), Tungsten (W), Gold (Au), Platinum (Pt) and Aluminum (Al), Ru (Ruthenium) and a combination thereof.

12. The ME antenna of claim 10, wherein the piezoelectric layer comprises a material comprising at least one of the materials selected from Aluminum Nitride Scadium Nitride (AlS (N), Aluminum Nitride (AlN), (Hf,X) $O_2$ with X=Zr, Si, Barium titanate ($BaTiO_3$), Gallium phosphate ($GaPO_4$), Lanthanum gallium silicate (LGS), Lead scandium tantalate (PST), Zinc oxide (ZnO), Quartz, Lead zirconate titanate (PZT), Lithium tantalate ($LiTaO_3$), Lead lanthanum zirconate titanate (PLZT), Bismuth ferrite (BFO), Lead magnesium niobate-lead titanate (PMN-PT), Lead-zinc niobate lead titanate (PZN-PT), Polyvinylidene fluoride (PVDF, PVDF (-TrFE)), Sodium bismuth titanate (NBT) and a combination thereof.

13. The ME antenna of claim 10, wherein the magnetostrictive layer comprises a material comprising at least one of the magnetic materials selected from Iron (Fe), Nickel (Ni), Cobalt (Co), Iron gallium (FeGa), Iron gallium alloy with formula FeGaX where X=B, C, Iron cobalt (FeCo), Iron cobalt alloy with formula FeCoX where X=B, C, V, Metglas, Iron cobalt silicon boron (FeCoSiB), Nickel iron (NiFe), Nickel iron alloy with formula NiFeX where X=Cu, Zn, Co, Mn, V, Al, Ta, Ru, Nickel molybdenum alloy, Iron silicon alloy, Cobalt platinum alloy, Terfenol and Terfenol-D ($Tb_xDy_{1-x}Fe_2$), and Nickel ferrite, Nickel zinc ferrite, Cobalt ferrite, Barium ferrite, Nickel zinc-aluminum ferrite, Manganese zinc ferrite, Strontium ferrite, Lithium ferrite, hexaferrite and a combination thereof.

14. The ME antenna of claim 10, wherein at least two resonators are made of different materials.

15. The ME antenna of claim 10, wherein at least one resonator is configured with an air cavity below, on said substrate layer so that the bottom electrode layer area of the resonator is suspended from the substrate layer.

16. The ME antenna of claim 10, wherein at least one resonator is coupled to an Acoustic Mirror material that is configured with multiple layers of alternating low acoustic impedance material layer and high acoustic impedance material layer.

17. The ME antenna of claim 16, wherein the low acoustic impedance material layer comprises at least one material of low acoustic impedance material of Aluminum (Al), Beryllium (Be), Bismuth (Bi), Cadmium (Cd), Cesium (Cs), Columbium (Nb), Copper (Cu), Gallium (Ga), Germanium (Ge), Indium (In), lead, Magnesium (Mg), Manganese (Mn), Plutonium (Pu), Potassium (K), Radium (Ra), Rubidium (Rb), Silver (Ag), Sodium (Na), Thallium (Tl), Thorium (Th), Tin (Sn), Titanium (Ti), Uranium dioxide ($UO_2$), Vanadium (V), Zinc (Zn), Zirconium (Zr), PMMA, quartz, Silicon dioxide ($SiO_2$), nano-porous methyl silsesquioxane (MSQ), nano-porous hydrogensilsesquioxane (HSQ), nano-porous mixtures of MSQ and HSQ, aerogel, Barium titanate ($BaTiO_3$), Gallium arsenide (GaAs), Lithium niobate ($LiNbO_3$), Zinc oxide (ZnO) and a combination thereof.

18. The ME antenna of claim 16, wherein the high acoustic impedance material layer comprises at least one material of high acoustic impedance selected from Gold (Au), Molybdenum (Mo), Nickel (Ni), Platinum (Pt), Tantalum (Ta), Tungsten (W), Uranium (U), diamond-like carbon (DLC), Silicon doped diamond-like carbon (Si-DLC), etc. and also some piezoelectric materials such as Aluminum Nitride (AlN), Boron nitride (BN), Gallium nitride (GaN), Silicon carbide (SiC) and a combination thereof.

19. A magnetoelectric ME antenna, comprising:
   at least two resonators electronically connected in series or in parallel, each of said resonators having a structure of
   a magnetostrictive layer;
   a top ground electrode layer;
   a piezoelectric layer;
   a bottom electrode layer;
   a substrate layer; and
   a plurality of Acoustic Mirror layers comprising a plurality of alternating layers of low acoustic impedance materials having an acoustic impedance value smaller than 50 g/cm$^2$-sec×10$^5$ and high acoustic impedance materials having an acoustic impedance value higher than 50 g/cm$^2$-sec×10$^5$;
   wherein said top ground electrode layer is deposited on said piezoelectric layer and is patterned with a shaped aperture; the magnetostrictive layer is also deposited on said piezoelectric layer through the shaped aperture; the piezoelectric layer is deposited on the bottom electrode layer which is deposited on the Acoustic Mirror layers; thereby when in use the magnetostrictive layer and the piezoelectric layer form a heterostructure on the bottom electrode layer, leading to magnetization oscillation that radiates electromagnetic waves by an induced acoustic resonance frequency or converting the electromagnetic waves into a piezoelectric voltage output, and said acoustic mirror layer prevents energy leakage into the substrate layer.

20. The ME antenna of claim 19, wherein the individual layer of the high acoustic impedance material has a thickness of about one-quarter or one-half mechanical wavelength of the resonant frequency of the piezoelectric resonator.

21. The ME antenna of claim 19, wherein the individual layer of the low acoustic impedance material has a thickness of about one-quarter or one-half mechanical wavelength of the resonant frequency of the piezoelectric resonator.

22. The ME antenna of claim 19, wherein the electrode layer is deposited with materials comprising at least one of the materials selected from Molybdenum (Mo), Titanium (Ti), Tungsten (W), Gold (Au), Platinum (Pt) and Aluminum (Al), and Ru (Ruthenium).

23. The ME antenna of claim 19, wherein the piezoelectric layer comprises a material comprising at least one of the materials Aluminum Nitride Scadium Nitride (AlS (N), Aluminum Nitride (AlN), (Hf,X) O$_2$ with X=Zr, Si, etc., Barium titanate (BaTiO$_3$), Gallium phosphate (GaPO$_4$), Lanthanum gallium silicate (LGS), Lead scandium tantalate (PST), Zinc oxide (ZnO), Quartz, Lead zirconate titanate (PZT), Lithium tantalate (LiTaO$_3$), Lead lanthanum zirconate titanate (PLZT), Bismuth ferrite (BFO), Lead magnesium niobate-lead titanate (PMN-PT), Lead-zinc niobate lead titanate (PZN-PT), Polyvinylidene fluoride (PVDF, PVDF(-TrFE)), Sodium bismuth titanate (NBT) and a combination thereof.

24. The ME antenna of claim 19, wherein the magnetostrictive layer comprises a material comprising at least one of the materials selected from Iron (Fe), Nickel (Ni), Cobalt (Co), Iron gallium (FeGa), Iron gallium alloy with formula FeGaX where X=B, C, Iron cobalt (FeCo), Iron cobalt alloy with formula FeCoX where X=B, C, V, Metglas, Iron cobalt silicon boron (FeCoSiB), Nickel iron (NiFe), Nickel iron alloy with formula NiFeX where X=Cu, Zn, Co, Mn, V, Al, Ta, Ru, Nickel molybdenum alloy, Iron silicon alloy, Cobalt platinum alloy, Terfenol and Terfenol-D (Tb$_x$Dy$_{1-x}$Fe$_2$), and Nickel ferrite, Nickel zinc ferrite, Cobalt ferrite, Barium ferrite, Nickel zinc-aluminum ferrite, Manganese zinc ferrite, Strontium ferrite, Lithium ferrite, hexaferrite and a combination thereof.

25. The ME antenna of claim 19, wherein at least two resonators are made of different materials.

26. The ME antenna of claim 19, wherein at least one resonator is configured with an air cavity below, on said substrate layer so that the bottom electrode layer area of the resonator is suspended from the substrate layer.

27. The ME antenna of claim 19, wherein at least one resonator is coupled to an Acoustic Mirror material that is configured with multiple layers of alternating low acoustic impedance material layer and high acoustic impedance materials layers.

28. The ME antenna of claim 27, wherein the low acoustic impedance material layer comprises at least one material of low acoustic impedance selected from Aluminum (Al), Beryllium (Be), Bismuth (Bi), Cadmium (Cd), Cesium (Cs), Columbium (Nb), Copper (Cu), Gallium (Ga), Germanium (Ge), Indium (In), lead, Magnesium (Mg), Manganese (Mn), Plutonium (Pu), Potassium (K), Radium (Ra), Rubidium (Rb), Silver (Ag), Sodium (Na), Thallium (Tl), Thorium (Th), Tin (Sn), Titanium (Ti), Uranium dioxide (UO$_2$), Vanadium (V), Zinc (Zn), Zirconium (Zr), PMMA, quartz, Silicon dioxide (SiO$_2$), nano-porous methyl silsesquioxane (MSQ), nano-porous hydrogensilsesquioxane (HSQ), nano-porous mixtures of MSQ and HSQ, aerogel, Barium titanate (BaTiO$_3$), Gallium arsenide (GaAs), Lithium niobate (LiNbO$_3$), Zinc oxide (ZnO) and a combination thereof.

29. The ME antenna of claim 27, wherein the high acoustic impedance material layer comprises at least one material of high acoustic impedanceselected from Gold (Au), Molybdenum (Mo), Nickel (Ni), Platinum (Pt), Tantalum (Ta), Tungsten (W), Uranium (U), diamond-like carbon (DLC), Silicon doped diamond-like carbon (Si-DLC), etc. and also some piezoelectric materials such as Aluminum Nitride (AlN), Boron nitride (BN), Gallium nitride (GaN), Silicon carbide (SiC) and a combination thereof.

30. An electronic device comprising the ME antenna of claim 1, for sensing vibration, acoustic signals, or low-frequency magnetic field sensing.

31. An electronic device comprising the ME antenna of claim 10, for sensing vibration, acoustic signals, or low-frequency magnetic field sensing.

32. An electronic device comprising the ME antenna of claim 19, for sensing vibration, acoustic signals, or low-frequency magnetic field sensing.

* * * * *